US010811355B2

(12) United States Patent
Brown et al.

(10) Patent No.: US 10,811,355 B2
(45) Date of Patent: Oct. 20, 2020

(54) METHODS OF FORMING SEMICONDUCTOR DEVICES

(71) Applicant: Micron Technology, Inc., Boise, ID (US)

(72) Inventors: William R. Brown, Boise, ID (US); Jenna L. Russon, Meridian, ID (US); Tim H. Bossart, Boise, ID (US); Brian R. Watson, Boise, ID (US); Nikolay A. Mirin, Boise, ID (US); David A. Kewley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/200,902

(22) Filed: Nov. 27, 2018

(65) Prior Publication Data
US 2019/0103350 A1 Apr. 4, 2019

Related U.S. Application Data

(60) Division of application No. 15/842,432, filed on Dec. 14, 2017, now Pat. No. 10,388,601, which is a (Continued)

(51) Int. Cl.
*H01L 23/528* (2006.01)
*H01L 21/768* (2006.01)
(Continued)

(52) U.S. Cl.
CPC ........ *H01L 23/528* (2013.01); *H01L 21/0337* (2013.01); *H01L 21/32139* (2013.01);
(Continued)

(58) Field of Classification Search
CPC ............... H01L 23/528; H01L 21/0337; H01L 21/32139
See application file for complete search history.

(56) References Cited

U.S. PATENT DOCUMENTS 5,289,037 A  2/1994  Savignac et al.
5,315,542 A  5/1994  Melzner
(Continued)

FOREIGN PATENT DOCUMENTS

DE  4139719 C1  4/1993
JP  60-007147 A  1/1985
(Continued)

OTHER PUBLICATIONS

European Search Report and Written Opinion from European Application No. 16842509.8, dated Mar. 20, 2019, 10 pages.
(Continued)

*Primary Examiner* — David A Zarneke
(74) *Attorney, Agent, or Firm* — TraskBritt

(57) ABSTRACT

A semiconductor device including conductive lines is disclosed. First conductive lines each comprise a first portion, a second portion, and an enlarged portion, the enlarged portion connecting the first portion and the second portion of the first conductive line. The semiconductor device includes second conductive lines, at least some of the second conductive lines disposed between a pair of the first conductive lines, each second conductive line including a larger cross-sectional area at an end portion of the second conductive line than at other portions thereof. The semiconductor device includes a pad on each of the first conductive lines and the second conductive lines, wherein the pad on each of the second conductive lines is on the end portion thereof and the pad on each of the first conductive lines is on the enlarged portion thereof.

20 Claims, 24 Drawing Sheets

Related U.S. Application Data continuation of application No. 14/838,768, filed on Aug. 28, 2015, now Pat. No. 9,911,693.

(51) Int. Cl.

| | | |
|---|---|---|
| *H01L 27/11582* | (2017.01) | |
| *H01L 21/033* | (2006.01) | |
| *H01L 21/3213* | (2006.01) | |
| *H01L 49/02* | (2006.01) | |
| *H01L 27/108* | (2006.01) | |
| *G01R 31/26* | (2020.01) | |
| *H01L 21/66* | (2006.01) | |
| *G01R 1/073* | (2006.01) | |
| *H01L 27/02* | (2006.01) | |
| *H01L 27/11519* | (2017.01) | |
| *G06F 30/39* | (2020.01) | |

(52) U.S. Cl.
CPC .. *H01L 21/76838* (2013.01); *H01L 27/11582* (2013.01); *H01L 28/00* (2013.01); *G01R 1/073* (2013.01); *G01R 31/2601* (2013.01); *G06F 30/39* (2020.01); *H01L 21/76816* (2013.01); *H01L 21/76895* (2013.01); *H01L 22/30* (2013.01); *H01L 22/32* (2013.01); *H01L 22/34* (2013.01); *H01L 23/5283* (2013.01); *H01L 27/0207* (2013.01); *H01L 27/10882* (2013.01); *H01L 27/10885* (2013.01); *H01L 27/10888* (2013.01); *H01L 27/10891* (2013.01); *H01L 27/11519* (2013.01)

(56) References Cited

U.S. PATENT DOCUMENTS

| | | | |
|---|---|---|---|
| 6,410,948 | B1 | 6/2002 | Tran et al. |
| 7,105,873 | B2 | 9/2006 | Sekiguchi et al. |
| 7,227,266 | B2 | 6/2007 | Wang |
| 7,294,545 | B2 | 11/2007 | Tran |
| 7,326,613 | B2 | 2/2008 | Yun et al. |
| 7,759,704 | B2 | 7/2010 | Popp et al. |
| 7,782,671 | B2 | 8/2010 | Iizuka |
| 8,129,791 | B2 | 3/2012 | Maekawa |
| 8,390,051 | B2 | 3/2013 | Bicksler |
| 8,659,159 | B2 | 2/2014 | Sudo |
| 8,674,522 | B1 | 3/2014 | Pratt et al. |
| 8,729,708 | B2 | 5/2014 | Bicksler |
| 8,823,149 | B2 | 9/2014 | Jakubowski et al. |
| 9,147,686 | B2 | 9/2015 | Sako et al. |
| 9,455,225 | B2 | 9/2016 | Funane |
| 9,768,115 | B2 | 9/2017 | Choi et al. |
| 2006/0046422 | A1 | 3/2006 | Tran et al. |
| 2006/0157833 | A1 | 7/2006 | Mashita et al. |
| 2006/0231955 | A1 | 10/2006 | Herold et al. |
| 2006/0273405 | A1 | 12/2006 | Sekiguchi et al. |
| 2006/0284259 | A1 | 12/2006 | Lee et al. |
| 2007/0218627 | A1 | 9/2007 | Lattard et al. |
| 2008/0067678 | A1 | 3/2008 | Kim |
| 2008/0073672 | A1 | 3/2008 | Kato et al. |
| 2008/0251827 | A1 | 10/2008 | Cheng et al. |
| 2008/0253160 | A1 | 10/2008 | Popp et al. |
| 2008/0277712 | A1 | 11/2008 | Ding et al. |
| 2010/0038795 | A1 | 2/2010 | Aburada et al. |
| 2010/0144150 | A1 | 6/2010 | Sills et al. |
| 2010/0295183 | A1 | 11/2010 | Sandhu et al. |
| 2011/0198758 | A1 | 8/2011 | Jeon et al. |
| 2011/0316165 | A1 | 12/2011 | You et al. |
| 2012/0025402 | A1 | 2/2012 | Bicksler |
| 2012/0106252 | A1 | 5/2012 | Ozaki et al. |
| 2012/0181705 | A1 | 7/2012 | Tang et al. |
| 2012/0225388 | A1 | 9/2012 | Umatate et al. |
| 2012/0261831 | A1 | 10/2012 | Sudo |
| 2013/0241073 | A1 | 9/2013 | Hashimoto et al. |
| 2013/0316073 | A1 | 11/2013 | Wang |
| 2014/0078826 | A1 | 3/2014 | Sel et al. |
| 2014/0264893 | A1 | 9/2014 | Pratt et al. |
| 2014/0304666 | A1 | 10/2014 | Fang et al. |
| 2014/0329384 | A1 | 11/2014 | Sudo |
| 2015/0061143 | A1 | 3/2015 | Kim et al. |
| 2017/0062324 | A1 | 3/2017 | Brown et al. |

FOREIGN PATENT DOCUMENTS

| | | |
|---|---|---|
| JP | 02-003276 A | 1/1990 |
| JP | 02-265271 A | 10/1990 |
| JP | 04-287368 A | 10/1992 |
| JP | 05-175337 A | 7/1993 |
| JP | 05-226614 A | 9/1993 |
| JP | 05-243527 A | 9/1993 |
| JP | 05-283644 A | 10/1993 |
| JP | 05-343645 A | 12/1993 |
| JP | 06-021395 B2 | 3/1994 |
| JP | 06-151768 A | 5/1994 |
| JP | 09-082910 A | 3/1997 |
| JP | 2001-196550 A | 7/2001 |
| JP | 2002-299472 A | 10/2002 |
| JP | 2002-313970 A | 10/2002 |
| JP | 2004-031850 A | 1/2004 |
| JP | 2005-260258 A | 9/2005 |
| JP | 2011-071207 A | 4/2011 |
| JP | 2012-019211 | 1/2012 |
| JP | 2012-064939 A | 3/2012 |
| JP | 2012-511254 A | 5/2012 |
| JP | 2012-204494 A | 10/2012 |
| JP | 2012-222279 A | 11/2012 |
| JP | 2012-527773 A | 11/2012 |
| JP | 2012-253354 A | 12/2012 |
| JP | 2013-138203 A | 7/2013 |
| JP | 2014-032938 A | 2/2014 |
| JP | 2014-216438 A | 11/2014 |
| JP | 2014-229694 A | 12/2014 |

OTHER PUBLICATIONS

Japanese Notice of Rejection Grounds for Japanese Application No. 2018506100, dated Apr. 3, 2019, 13 pages.
Korean Notice of Reasons for Rejection from Korean Application No. 10-2018-7008340, dated Sep. 25, 2019, 9 pages.
Korean Notice of Reasons for Rejection from Korean Application No. 10-2018-7008340, dated Mar. 25, 2019, 6 pages.
International Written Opinion of the International PCT Application No. PCT/US2016/044246, dated Oct. 20, 2016, 3 pages.
International Search Report of the International PCT Application No. PCT/US2016/044246, dated Oct. 20, 2016, 3 pages.
Singapore Search Report and Written Opinion from Singapore Application No. 11201800945R, dated Jan. 2, 2019, 8 pages.
Japanese Office Action for Application No. 2019-134332, dated Jul. 14, 2020, 11 pages.
Singapore Notice of Eligibility of Grant with Search Report for Application No. 10201912557W, dated Jul. 28, 2020, 8 pages.

METHODS OF FORMING SEMICONDUCTOR DEVICES

CROSS-REFERENCE TO RELATED APPLICATIONS

This application is a divisional of U.S. patent application Ser. No. 15/842,432, filed Dec. 14, 2017, now U.S. Pat. No. 10,388,601, issued Aug. 20, 2019, which is a continuation of U.S. patent application Ser. No. 14/838,768, filed Aug. 28, 2015, now U.S. Pat. No. 9,911,693, issued Mar. 6, 2018, the disclosure of each of which is hereby incorporated herein in its entirety by this reference.

TECHNICAL FIELD

Embodiments disclosed herein relate to semiconductor devices having conductive lines, each conductive line including an enlarged portion having a substantially larger area for a contact landing pad than other portions of the conductive line and methods of forming such conductive lines and semiconductor devices.

BACKGROUND

Memory devices provide data storage for electronic systems. Memory devices may include memory cells operatively coupled to one or more conductive lines, such as access lines (e.g., wordlines) and data lines (e.g., digit lines, such as bit lines) for reading and writing data to the memory cells. Individual memory cells are organized into individually addressable groups, such as bytes or words, which are accessed for read, program, or erase operations through address decoding circuitry using the wordlines and bit lines. The memory cells may be located at an intersection between a wordline and a bit line (e.g., as in a cross-point array, such as, for example, a three-dimensional ("3D") cross-point memory). Each of the wordlines and each of the digit lines may be in electrical communication with the memory cell. To address each memory cell, a voltage may be applied to a wordline or a digit line in communication with the memory cell.

In some memory arrays, contact to the wordlines or digit lines are made utilizing a so-called "shark jaw" layout. FIG. 1 illustrates a "shark jaw" layout including conductive lines 2, each connected to a contact landing pad 14. The conductive lines 2 are connected to a voltage supply by contacts 16 formed on the contact landing pads 14.

In the "shark jaw" layout, the conductive lines 2 are substantially "L-shaped" with each pair of contact landing pads 14 inset from an adjacent pair of the contact landing pads 14. However, because each pair of contact landing pads 14 is inset from an adjacent pair of contact landing pads 14, the "shark jaw" layout wastes real estate of the semiconductor device. As the design size of semiconductor devices shrinks, the wasted real estate minimizes the overall number of conductive lines 2 that can be formed on the semiconductor device.

Moreover, as semiconductor devices having smaller feature sizes are formed, the proximity of adjacent conductive lines may be problematic when forming conductive contacts to the conductive lines. For example, at reduced feature sizes, it may be difficult to register and align the conductive contacts with the conductive lines. Misplaced conductive contacts may span across more than one conductive line and cause a short across the conductive lines contacted by the conductive contacts. The "shark jaw" layout does not address issues with registration and alignment that arise as device features shrink.

DETAILED DESCRIPTION

Figure 1:
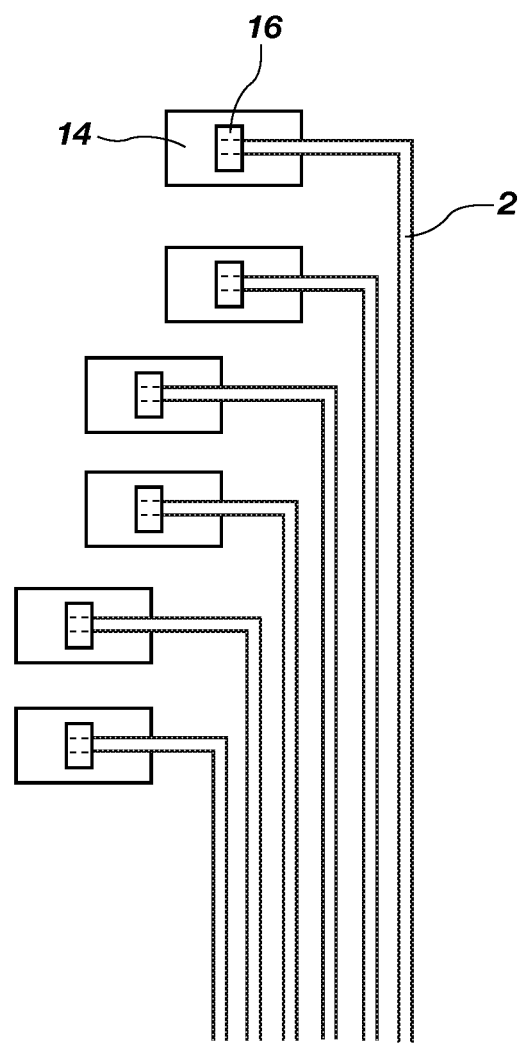
FIG. 1 is a schematic illustration of a prior art conductive line configuration having a so-called "shark jaw" layout.

The illustrations included herewith are not meant to be actual views of any particular systems or semiconductor devices, but are merely idealized representations that are employed to describe embodiments herein. Elements and features common between figures may retain the same numerical designation.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing conductive lines or semiconductor devices, and the semiconductor devices described below do not form a complete semiconductor device. Only those process acts and structures necessary to understand the embodiments described herein are described in detail below. Additional acts to form a complete semiconductor device may be performed by conventional techniques.

As used herein, the terms "horizontal" and "vertical" define relative positions of structures regardless of the orientation of the underlying material, and are orthogonal directions interpreted with respect to one another, as illustrated in the drawings being referred to when the structure is being described. As used herein, the term "vertical" means and includes a dimension substantially perpendicular to the dimension referred to with the term "horizontal," which is illustrated in the drawings as extending between left and right sides of the drawing.

As used herein, the term "array region" of a semiconductor substrate or of a semiconductor device means and includes a region of a semiconductor substrate or semiconductor device through which conductive lines extend, such as at locations proximate to memory cells or a contact array of the semiconductor substrate or semiconductor device. An array region may include at least a region of a semiconductor substrate or semiconductor device including portions of conductive lines that are located between end portions of the conductive lines, although the array region may also include the end portions of the conductive lines. Thus, the array region may include, at least, internal portions of conductive lines.

As used herein, the term "peripheral region" of a semiconductor substrate or of a semiconductor device means and includes regions of a semiconductor substrate or semiconductor other than an array region. For example, a peripheral region may include end regions of conductive lines while an array region may include internal portions of the conductive lines that are between the end regions. Alternatively, a peripheral region may include a region that does not include any conductive lines.

Unless indicated otherwise, each of the materials described herein may be formed by conventional processes. For example, the materials described herein may be formed by sputtering, atomic layer deposition (ALD), chemical vapor deposition (CVD), physical vapor deposition (PVD), plasma-enhanced chemical vapor deposition (PECVD), low pressure chemical vapor deposition (LPCVD), or other suitable deposition process.

According to some embodiments, a semiconductor device including conductive lines is disclosed. Each conductive line may include an enlarged portion having a larger cross-sectional area relative to other portions of the conductive line. At least some of the enlarged portions may be located between end portions of the respective conductive line on which the enlarged portion is located. Other conductive lines may have a larger cross-sectional area at end (e.g., terminal) portions of the conductive line. Contact landing pads may be formed on the portions of the conductive lines having the larger cross-sectional area. Thus, the contact landing pads may be formed on enlarged portions of some of the conductive lines between end portions of the lines and on end portions of at least some of the other conductive lines. Conductive contacts may be formed on the contact landing pads to form electrical connections to electrical circuitry of memory cells located within a semiconductor array. Since the conductive contacts and contact landing pads are formed on portions of the conductive lines having the larger cross-sectional areas, proper alignment and registration may be achieved even as feature sizes continue to shrink. In addition, the number of memory cells on the semiconductor device may be maximized. Methods of forming the conductive lines and contacts for the conductive lines are disclosed, as is a semiconductor device including the conductive lines.

Figure 2A:
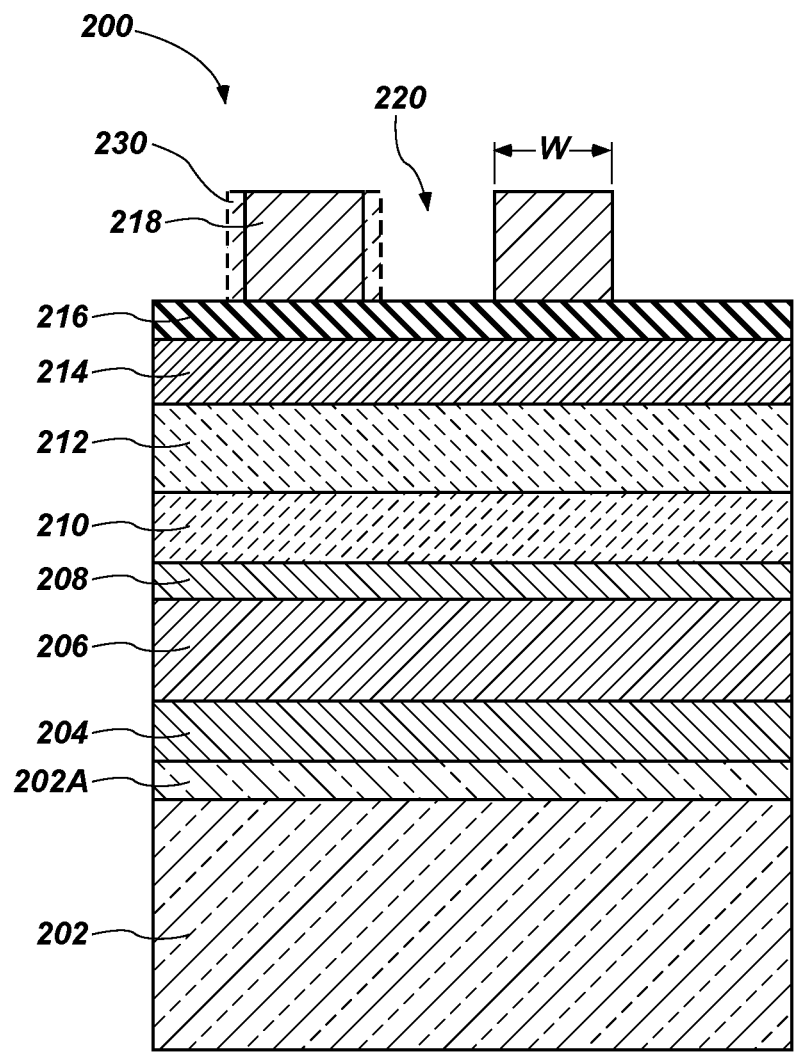
FIG. 2A through FIG. 14 are cross-sectional and plan views of a semiconductor device during various stages of fabrication, in accordance with an embodiment of the present disclosure.
Figure 2B:
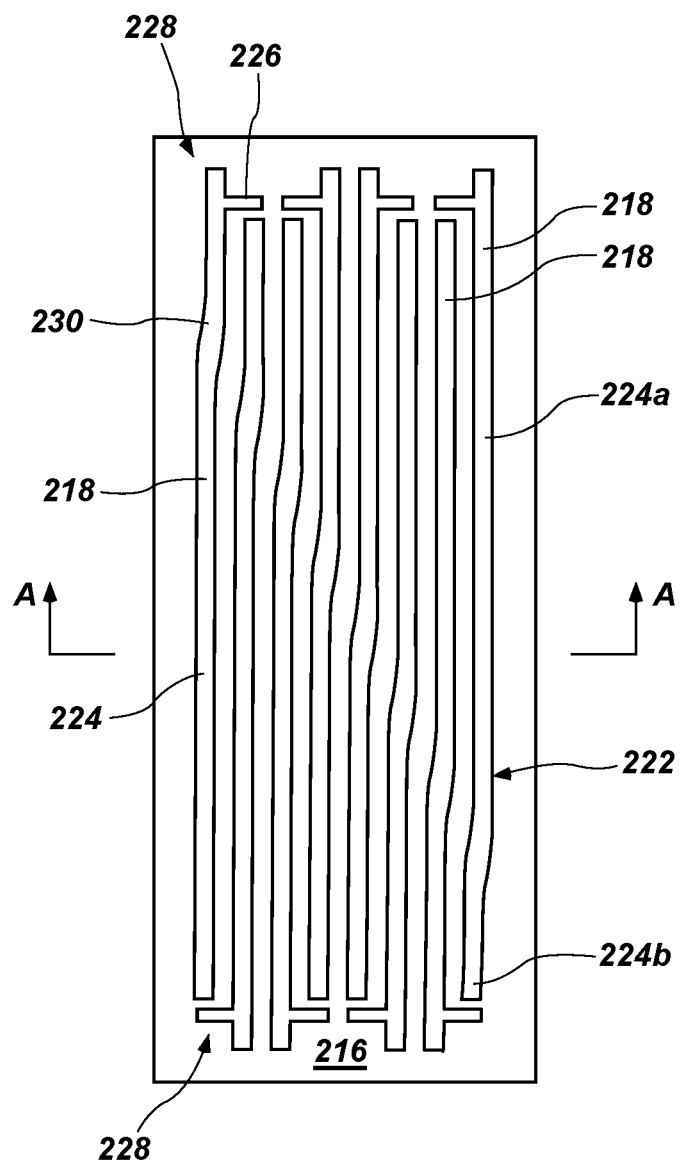

FIG. 2A illustrates an enlarged cross-sectional view of a portion of a semiconductor device 200 taken along section line A-A of FIG. 2B, according to embodiments of the disclosure. The semiconductor device 200 may include a nitride material 204 overlying a semiconductor material 202. The semiconductor material 202 may include an array material, such as a stack of materials including, for example, a bottom electrode, a phase change material between the bottom electrode and a middle electrode, and a memory material between the middle electrode and a top electrode, on a semiconductor substrate, such as a conventional silicon substrate. The substrate may be a semiconductor substrate, a base semiconductor material on a supporting substrate, a metal electrode, or a semiconductor substrate having one or more materials, structures, or regions formed thereon. The substrate may be a conventional silicon substrate or other bulk substrate including semiconductor material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form material, regions, or junctions in the base semiconductor structure or foundation. In some embodiments, the semiconductor material 202 may include a computer bus, such as, for example, a signal bus.

The semiconductor material 202 may further include memory cells arranged in rows and columns across the semiconductor device 200. Individual memory cells may be located at an intersection between, for example, a wordline and a bit line. The memory cells may be stacked in a 3D array, such as in 3D cross-point memory devices. At least some materials of the semiconductor material 202 may be sensitive to high temperatures (e.g., electrodes containing carbon, memory materials or phase change materials including a chalcogenide, etc.). In some embodiments, a top portion of the semiconductor material 202 may include active areas, such as source and drain regions, capacitors, wordlines, bit lines, conductive materials in contact with the memory cells, etc.

A conductive material 202A may overlie the semiconductor material 202. The conductive material 202A may include an electrically conductive material such as, for example, copper, tungsten, aluminum, titanium, polysilicon, or other conductive materials. As will be described herein, conductive lines may be patterned and formed from the conductive material 202A.

The nitride material 204 may overlie the conductive material 202A. The nitride material 204 may include silicon nitride, silicon oxynitride, and combinations thereof. An oxide material 206 may overlie the nitride material 204. In some embodiments, the oxide material 206 includes tetraethyl orthosilicate (TEOS).

Another nitride material 208 may overlie the oxide material 206. The another nitride material 208 may include silicon nitride, silicon oxynitride, or combinations thereof. In some embodiments, the another nitride material 208 may be the same as the nitride material 204.

An etch selective material 210 may overlie the another nitride material 208. The etch selective material 210 may exhibit an etch selectivity relative to the etch selectivity of oxides (e.g., the oxide material 206) and nitrides (e.g., the nitride material 204 and the another nitride material 208) of the semiconductor device 200. Therefore, the oxide and nitride materials may be selectively removed relative to the etch selective material 210. The etch selective material 210 may also exhibit low sensitivity to high temperatures used during processing of the semiconductor device 200. In one embodiment, the etch selective material 210 is silicon, such as amorphous silicon.

A silicon oxide material 212 may overlie the etch selective material 210. In some embodiments, the silicon oxide material 212 is silicon dioxide ($SiO_2$).

A sacrificial material 214 may overlie the silicon oxide material 212. In some embodiments, the sacrificial material 214 is a carbon-containing mask, such as a spin-on carbon material (e.g., a spin-on carbon hardmask). The sacrificial material 214 may exhibit thermal stability at processing temperatures of the semiconductor device 200.

A dielectric anti-reflective coating (DARC) material 216 may overlie the sacrificial material 214. In some embodiments, the DARC material 216 includes a silicon nitride material, a silicon oxynitride material, such as $Si_xO_yN_z$, wherein x is between about 10 and about 60, y is between about 20 and about 50, and z is between about 10 and about 20, or other suitable DARC materials that may be known in the art.

A photoresist material 218 may overlie the DARC material 216. The photoresist material 218 may be formed onto the semiconductor device 200 and patterned at dimensions within the limits of conventional photolithography techniques. The formation and patterning of the photoresist material 218 may be conducted by conventional techniques, which are not described in detail herein. Adjacent portions of the photoresist material 218 may be separated by a gap 220. The photoresist material 218 may be a conventional 193 nm photoresist, a conventional 248 nm photoresist, or a conventional photoresist material sensitive to radiation of a different wavelength. The photoresist material 218 may be a positive or a negative photoresist. Resist materials, such as positive and negative resists, are known in the art and, therefore, are not described in detail herein.

FIG. 2B illustrates a plan view of the semiconductor device 200 of FIG. 2A. The photoresist material 218 may be formed into a pattern of photoresist lines 222, each having a width, W (FIG. 2A). The photoresist lines 222 may terminate at peripheral regions of the semiconductor device 200. The photoresist lines 222 may each include a first portion 224 and a second portion 226. The first portion 224 may extend from one end of the semiconductor device 200 to another end of the semiconductor device 200. In some embodiments, the first portion 224 may extend in a generally vertical direction along a longitudinal axis of the photoresist lines 222. The second portion 226 may be substantially perpendicular to the first portion 224 (and to the longitudinal axis of the photoresist lines 222). Thus, the second portion 226 may extend in a generally horizontal direction, perpendicular to the longitudinal axis of the photoresist lines 222.

The first portion 224 may include a first linear portion 224a, a second linear portion 224b that is laterally (e.g., horizontally) offset from the first linear portion 224a, and an enlarged portion 230. The first linear portion 224a and the second linear portion 224b may be connected via the enlarged portion 230. The photoresist lines 222 may exhibit a larger cross-sectional area at the enlarged portion 230 than at either of the first linear portion 224a and the second linear portion 224b. For example, in some embodiments, the enlarged portion 230 may have a greater width than either of the first linear portion 224a and the second linear portion 224b. Enlarged portions 230 of adjacent photoresist lines 222 may extend in a generally diagonal direction across the semiconductor device 200 such that the enlarged portions 230 are laterally and longitudinally offset from one another. As will be explained in more detail herein, the greater cross-sectional area at the enlarged portion 230 may provide an increased available area for forming a contact landing pad and a corresponding conductive pad on a conductive line. As shown in FIG. 2B, the photoresist lines 222 have a weave pattern and are separated from one another by gaps 220 (FIG. 2A) having a corresponding weave pattern. As described in more detail below, the weave pattern is transferred to underlying materials and then pitch multiplied to form the conductive lines having portions with larger cross-sectional areas.

The enlarged portion 230 may include a widened portion relative to other portions of the photoresist line 222. For example, the enlarged portion 230 may have a larger cross-sectional area than other portions of the photoresist line 222. The enlarged portion 230 of a photoresist line 222 may be located between end portions 228 of the photoresist line 222 (e.g., such as within an array region of the semiconductor device 200). In some embodiments, the enlarged portion 230 extends from the first portion 224 of the photoresist lines 222 at an angle of between about 10° and about 30° relative to the longitudinal axis of the photoresist line 222, such as about 20° C. In some embodiments, the enlarged portion 230 includes at least one arcuate (e.g., curved) or semi-arcuate surface.

At least one end portion 228 of each photoresist line 222 may be located at an intersection of the first portion 224 and the second portion 226 of the respective photoresist line 222. As illustrated in FIG. 2B, about one half of the photoresist lines 222 have the end portions 228 with an intersecting first portion 224 and second portion 226 at one end of the semiconductor device 200 and about one half of the photoresist lines 222 have such end portions 228 at an opposite end of the semiconductor device 200. In some embodiments, the end portions 228 are located in a peripheral region of the semiconductor device 200 and the enlarged portions 230 are located in an array region of the semiconductor device 200.

Referring again to FIG. 2A, the enlarged portion 230 of one of the photoresist lines 222 (FIG. 2B) of the photoresist material 218 is illustrated in broken lines. Although cross-sectional views illustrated herein may not depict the enlarged portion 230 or a material including a larger cross-sectional area corresponding to the enlarged portion 230, such larger cross-sectional areas are more clearly illustrated in the plan views herein and it is understood that the cross-sectional view herein are enlarged cross-sectionals view of a portion of the semiconductor device 200 taken along section line A-A of the plan views.

Figure 3:
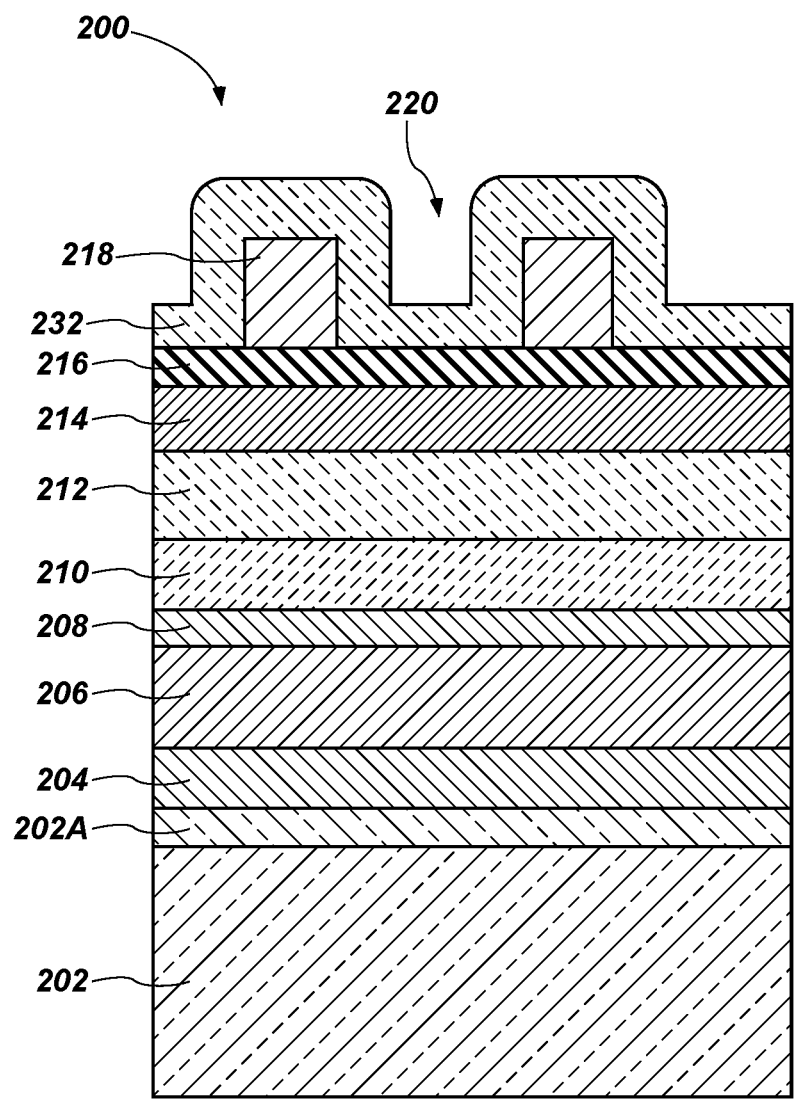

Referring to FIG. 3, a portion of the photoresist material 218 may be removed (e.g., "trimmed") to increase a dimension of the gap 220 and reduce a width of the photoresist lines 222. The portion of the photoresist material 218 may be removed by dry etchants (e.g., plasmas) such as, for example, sulfur dioxide, oxygen, chlorine gas, HCl, HBr, $CF_4$, $CHF_3$, $CH_2F_2$, $CH_3F$, $C_4F_8$, $C_2F_6$, $C_3F_8$, $C_4F_6$, $SF_6$, and combinations thereof. Thus, the dimensions of the photoresist lines 222 may be reduced to a dimension smaller than that capable of being formed with conventional photolithography techniques. By way of non-limiting example, the portion of the photoresist material 218 may be removed so that a width of the photoresist material 218 remaining is within a range between about 20 nm and about 40 nm, such as between about 20 nm and about 30 nm, or between about 30 nm and about 40 nm. In some embodiments, the photoresist material 218 is trimmed to a dimension of between about one-fourth and about three-eighths a pitch of the photoresist lines 222, wherein a pitch of the photoresist lines 222 is equal to a center-to-center distance between adjacent photoresist lines 222, as the term is understood in the art.

A spacer material 232 may be formed over the trimmed photoresist material 218. The spacer material 232 may be conformally formed on sidewalls and a top surface of the trimmed photoresist material 218 and on a top surface of the DARC material 216. The spacer material 232 may include an oxide material such as a silicon oxide ($SiO_x$) material. In some embodiments, the spacer material 232 includes silicon dioxide ($SiO_2$). The spacer material 232 may be the same material as the silicon oxide material 212. In some embodiments, the spacer material 232 is formed by atomic layer deposition. In some embodiments, the spacer material 232 may be formed to a thickness of about one-eighth of the pitch of the photoresist lines.

Figure 4A:
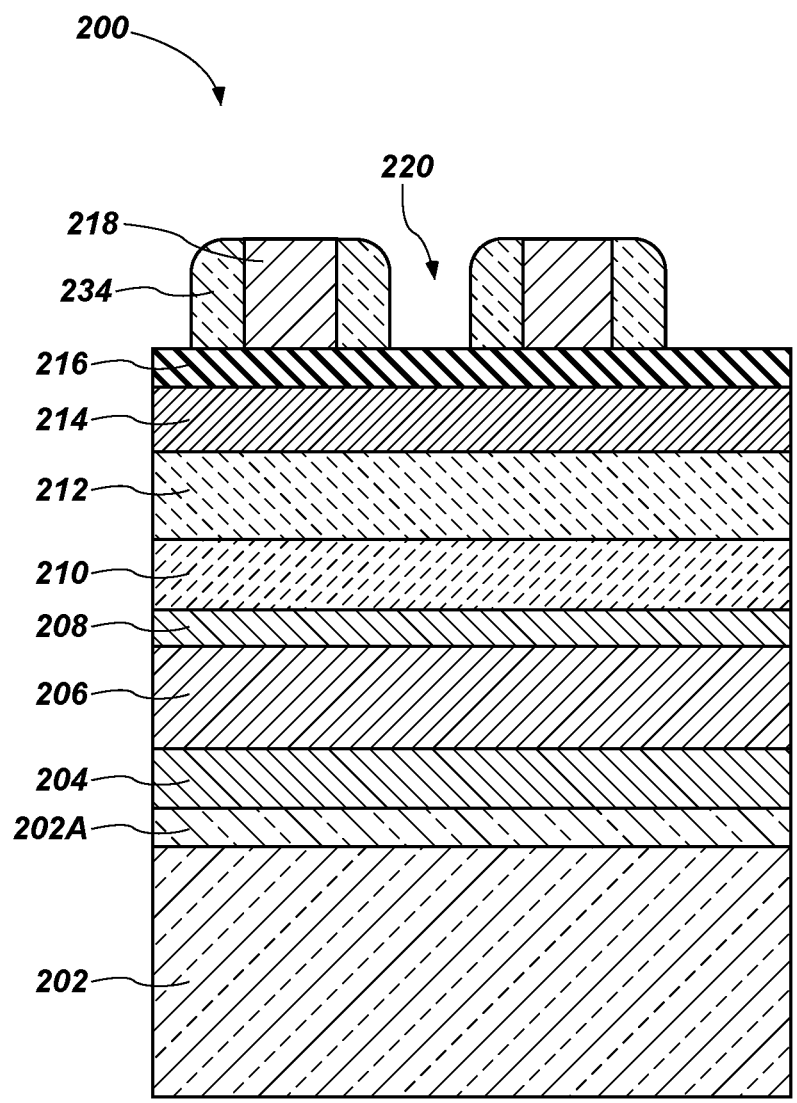
Figure 4B:
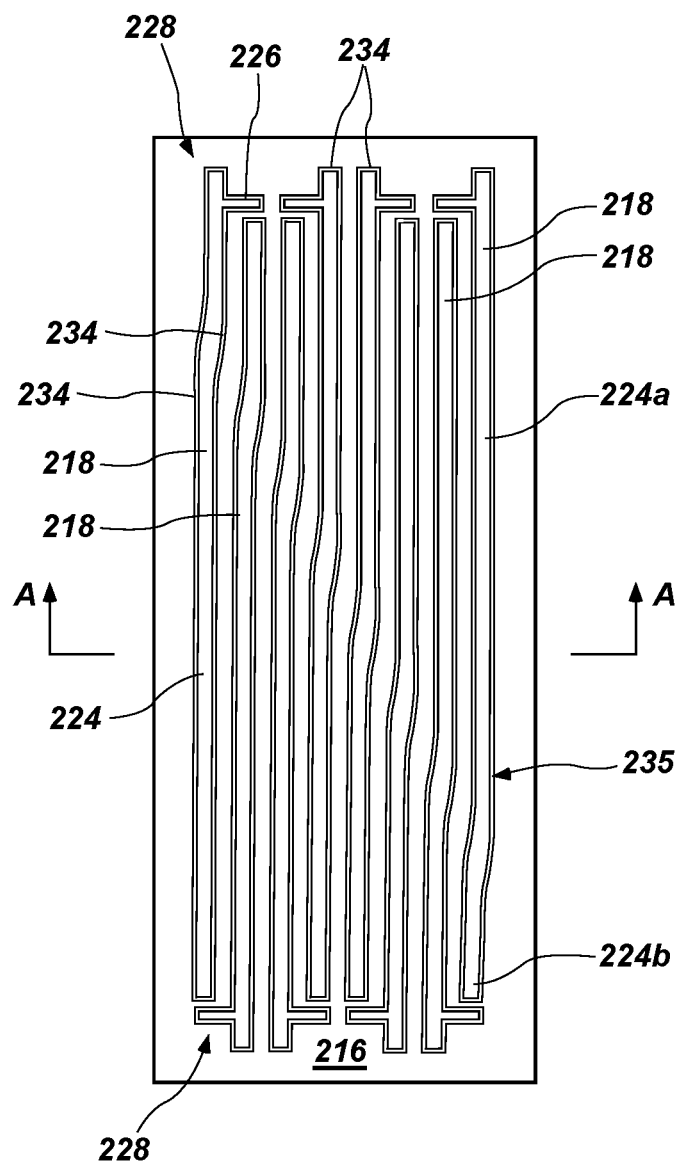

Portions of the spacer material 232 may be removed to form spacers 234 on sidewalls of the trimmed photoresist material 218 and to expose portions of the DARC material 216, as illustrated in FIG. 4A. In some embodiments, the spacer material 232 is removed by reactive-ion etching with a fluorocarbon-based dry etch chemistry including one or more of $CF_4$, $CHF_3$, $CH_2F_2$, $CH_3F$, $C_4F_8$, $C_2F_6$, $C_3F_8$, $C_4F_6$, $SF_6$, combinations thereof, or with other gases suitable for etching the spacer material 232. Referring to FIG. 4B, the spacer material 232 may form continuous loops 235 of the spacers 234 around the trimmed photoresist material 218.

Figure 5A:
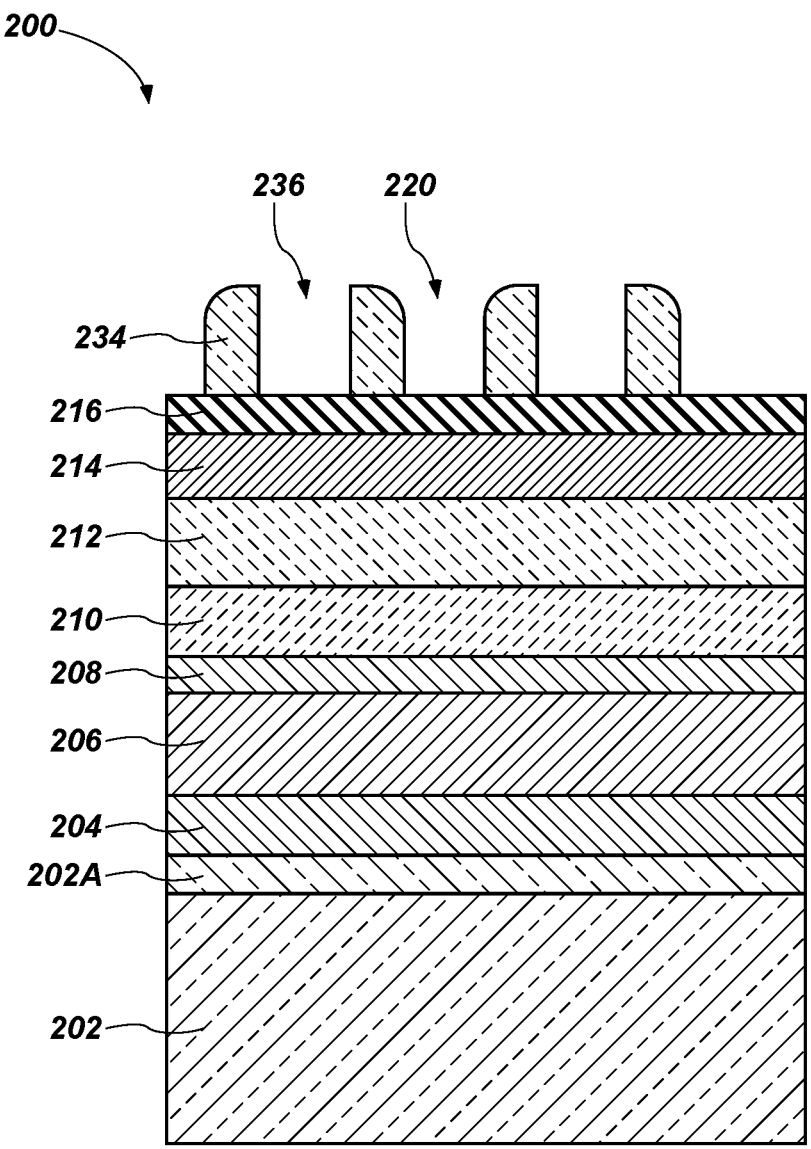

Referring to FIG. 5A, the trimmed photoresist material 218 within the loops 235 of the spacers 234 may be removed to form openings 236. The trimmed photoresist material 218 may be removed by exposing the trimmed photoresist material 218 to a solvent formulated to remove the trimmed photoresist material 218, as in stripping processes.

Figure 5B:
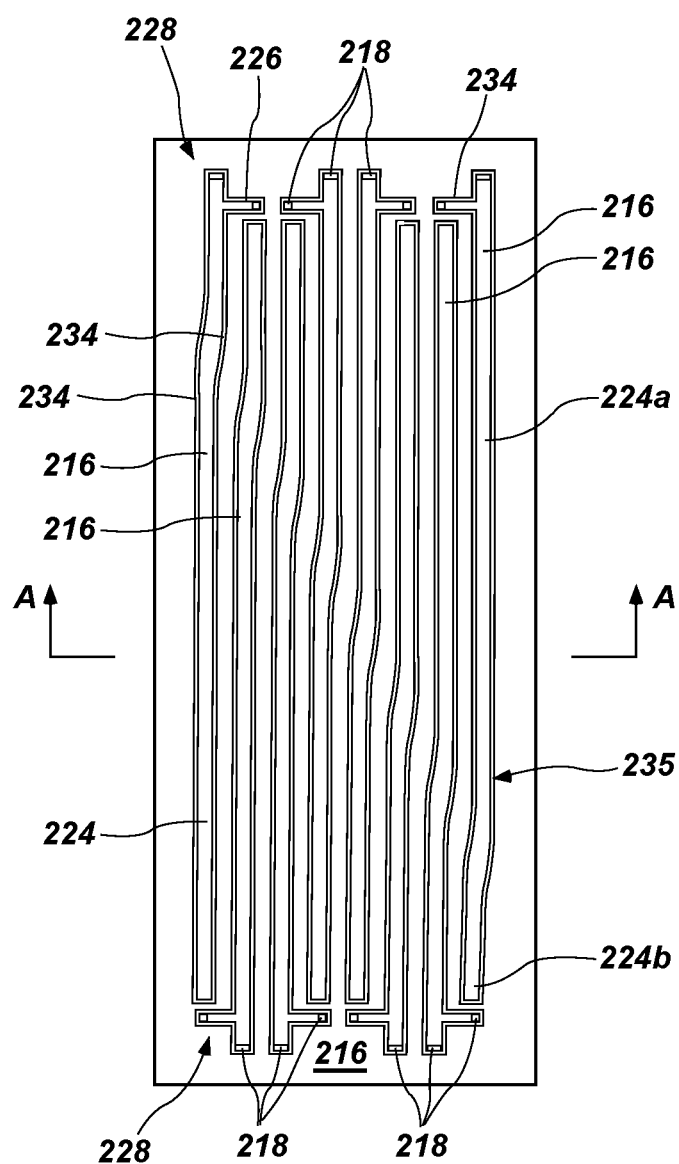

As illustrated in FIG. 5B, a portion of the trimmed photoresist material 218 may remain at the end portions 228 of the loops 235. In some embodiments, at least some of the photoresist material 218 may adhere to the spacers 234 at the end portions 228 of the semiconductor device 200. As will be described herein, the trimmed photoresist material 218 that remains on the semiconductor device 200 may protect the end portions 228 during subsequent processing acts, providing a larger surface area at the end portions 228 at which contact landing pads may be formed.

Figure 6A:
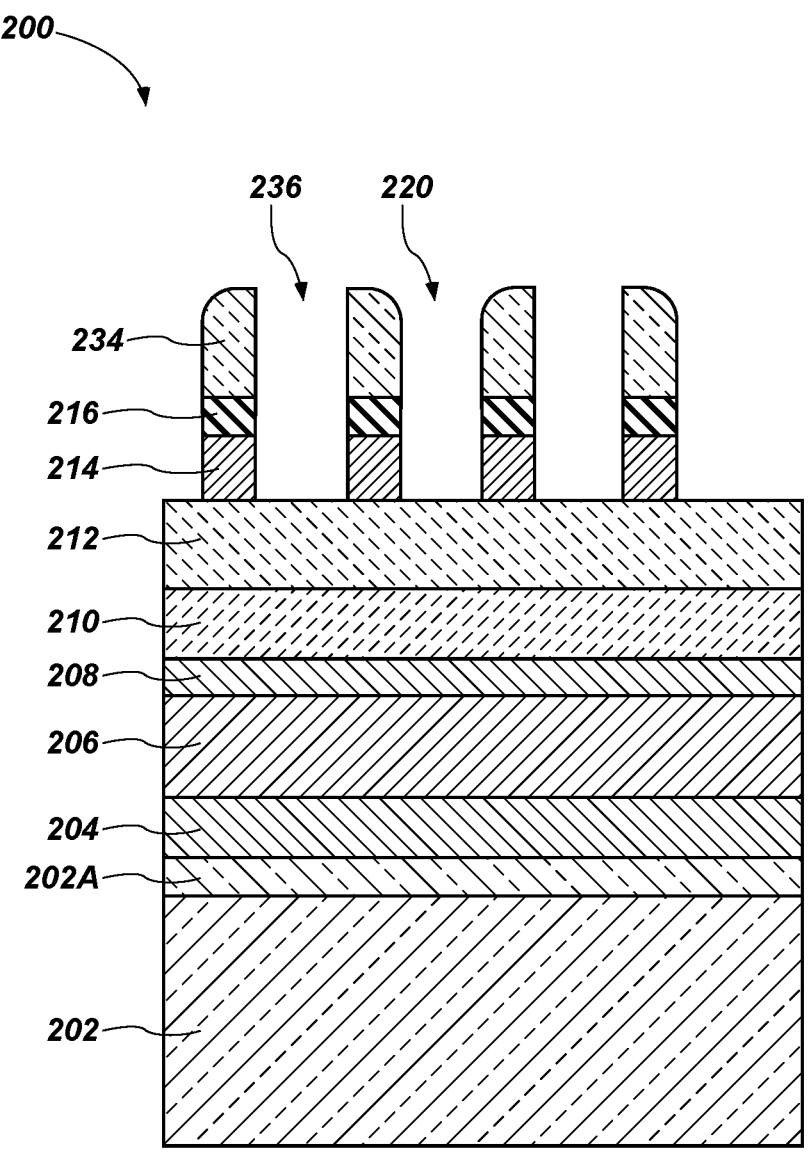
Figure 6B:
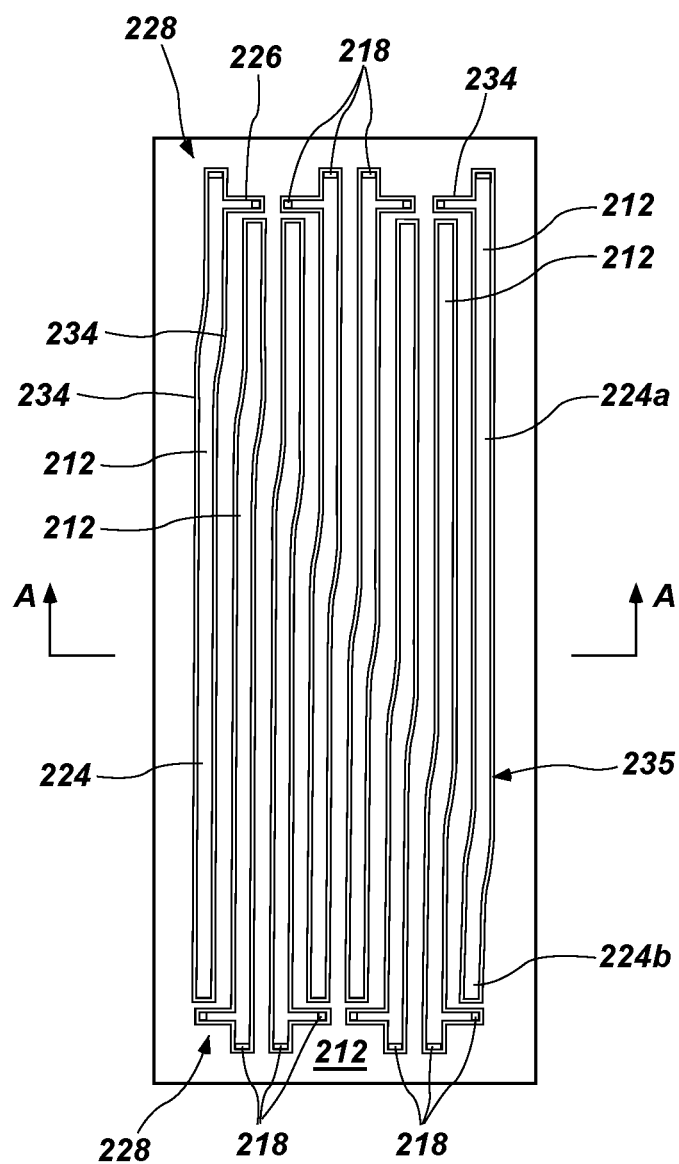

Referring to FIG. 6A, portions of the DARC material 216 and the sacrificial material 214 may be removed using the spacers 234 as a mask to selectively expose the silicon oxide material 212. FIG. 6A illustrates the semiconductor device 200 after portions of the DARC material 216 and the sacrificial material 214 have been removed through the spacers 234. The DARC material 216 and the sacrificial material 214 may be exposed to a plasma including, for example, $C_2F_6$, $O_2$, $N_2$, and combinations thereof, to remove the DARC material 216 and the sacrificial material 214. In other embodiments, the DARC material 216 and the sacrificial material 214 may be exposed to a solution including hydrofluoric acid, phosphoric acid ($H_3PO_4$), and combinations thereof, or other etchants suitable for removing the DARC material 216 and the sacrificial material 214, as may be known in the art. Referring to FIG. 6B, the trimmed photoresist material 218 may remain at the end portions 228 after removing portions of the DARC material 216 and the sacrificial material 214.

Figure 7A:
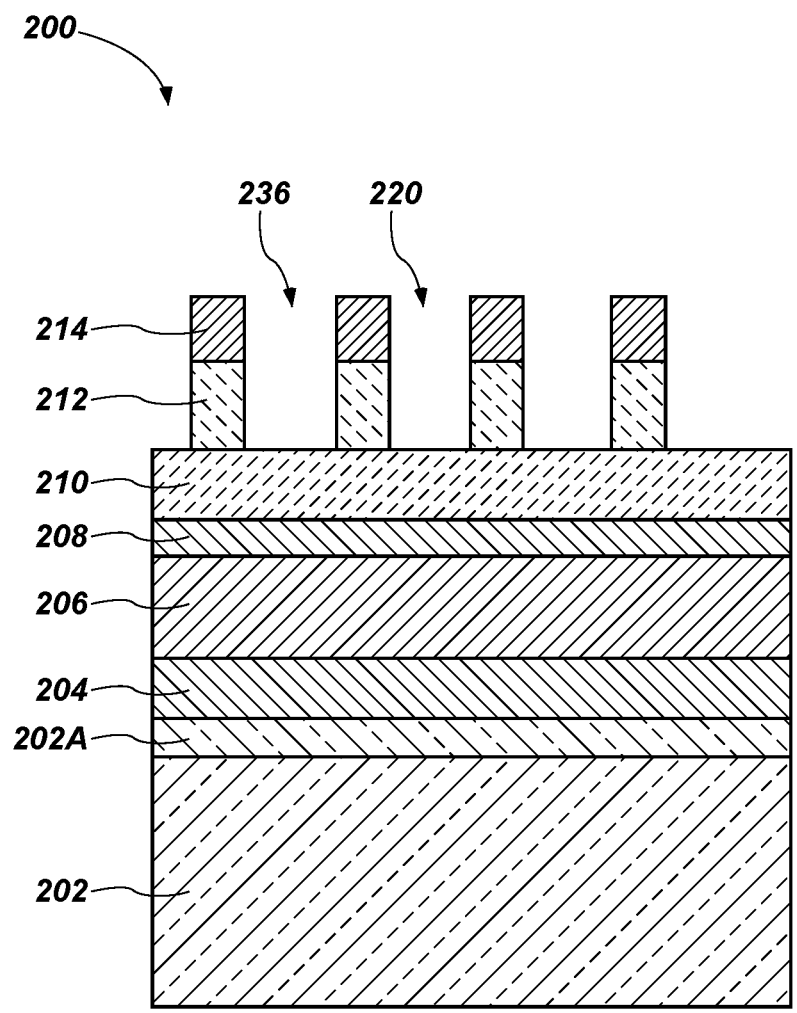

Referring to FIG. 7A, portions of the silicon oxide material 212 may be removed using the spacers 234, the DARC material 216, and the sacrificial material 214 to pattern the silicon oxide material 212. The spacers 234, the silicon oxide material 212, and the DARC material 216 may be removed with an etchant, such as a solution including one or more of hydrofluoric acid, nitric acid ($HNO_3$), potassium hydroxide, sodium hydroxide, or other wet etchants known in the art. In other embodiments, the spacers 234, the silicon oxide material 212, and the DARC material 216 may be removed with a dry etchant, such as with $CF_4$, $O_2$, $N_2$, $CHF_3$, $SO_2$, or other etchants known in the art to remove silicon dioxide.

Figure 7B:
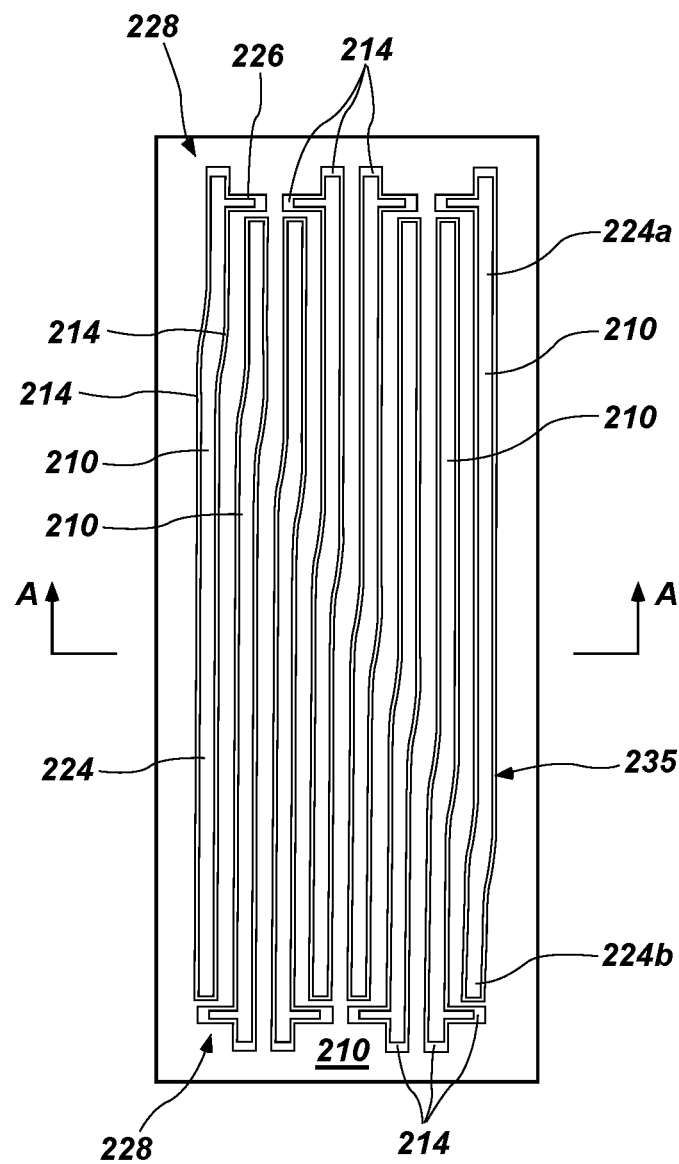

Referring to FIG. 7B, a portion of the sacrificial material 214 may remain at the end portions 228 of the etch selective material 210. Accordingly, the etch selective material 210 may not be substantially exposed at the end portions 228 and may be protected by the portion of the sacrificial material 214 remaining at the end portions 228.

Figure 8A:
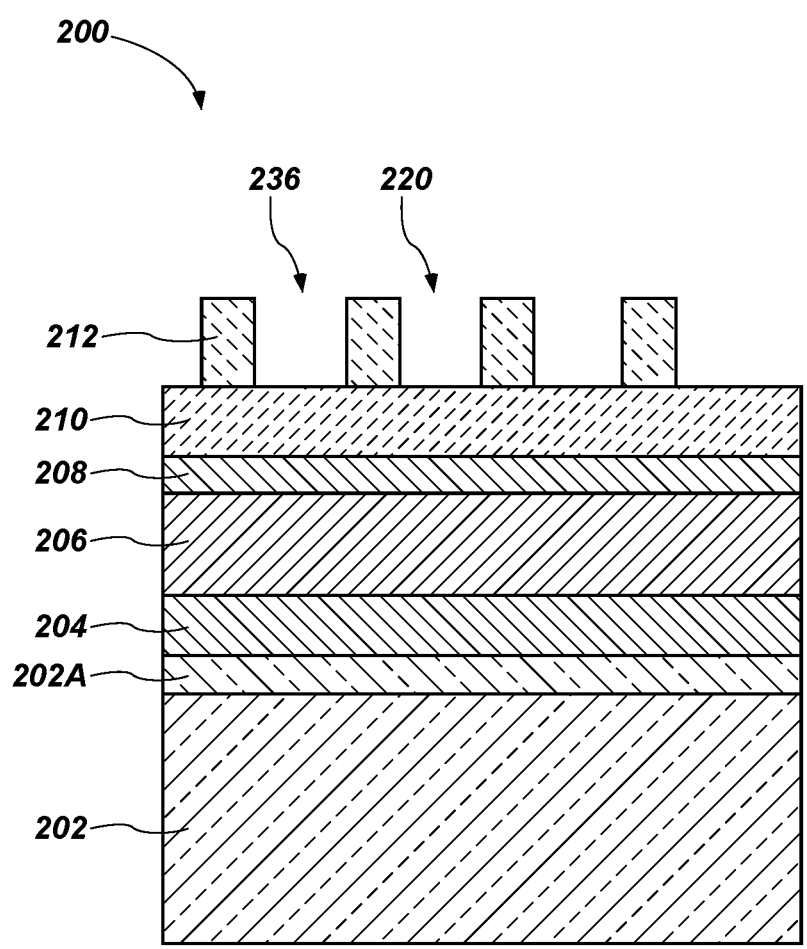
Figure 8B:
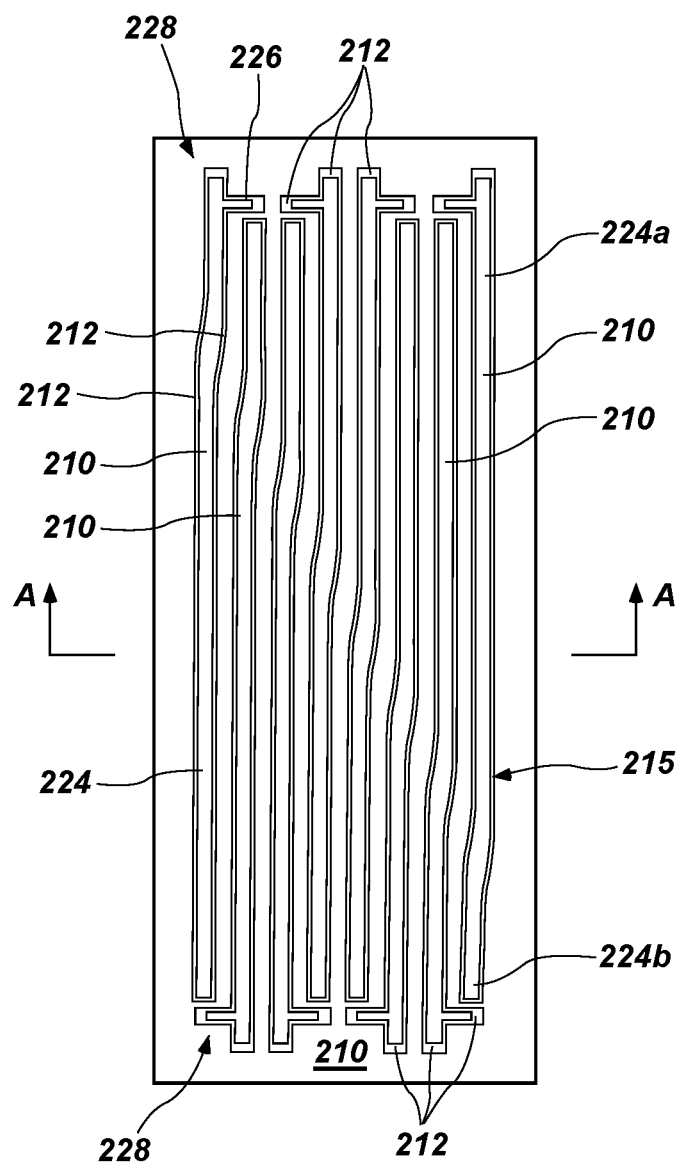

Referring to FIG. 8A, the sacrificial material 214 may be removed in a dry etch process, such as by exposing the sacrificial material 214 to a plasma comprising oxygen, sulfur dioxide, combinations thereof, or other etchants suitable for removing the sacrificial material 214. The silicon oxide material 212 may remain over the etch selective material 210 after removal of the sacrificial material 214. Referring to FIG. 8B, a pattern of loops 215 of the silicon oxide material 212 may overlie the semiconductor material 202 (FIG. 8A). The loops 215 of silicon oxide material 212 may correspond to the loops 235 (FIG. 7B). At least a portion of the end portions 228 of the loops 215 may be covered by the silicon oxide material 212.

Figure 9:
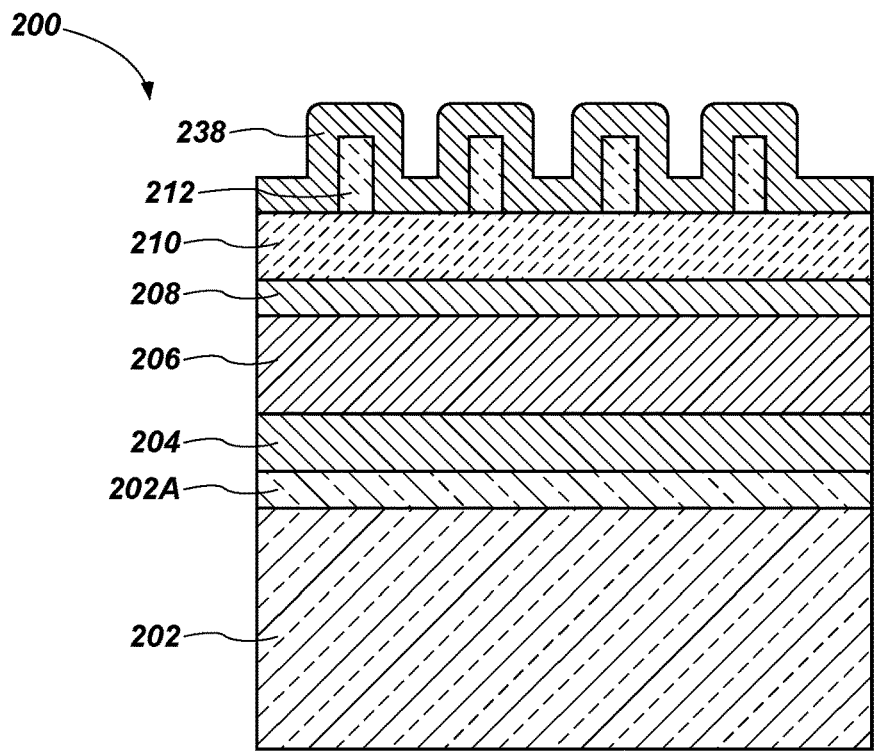

Referring to FIG. 9 through FIG. 11A, the loops 215 (FIG. 8B) of the silicon oxide material 212 may be used in a pitch multiplication process to form a pattern in the etch selective material 210 having about one-half the pitch of a pitch of the silicon oxide material 212. Referring to FIG. 9, a nitride spacer material 238 may be conformally formed over exposed surfaces of the semiconductor device 200, such as over the etch selective material 210 and the silicon oxide material 212, and may substantially cover the semiconductor device 200. The nitride spacer material 238 may at least partially fill gaps 220 (FIG. 3) and openings 236 (FIG. 5A) between adjacent portions of the silicon oxide material 212. In some embodiments, the nitride spacer material 238 is formed to a thickness of about one-eighth of the pitch of the photoresist lines 222 (FIG. 2B).

The nitride spacer material 238 may include silicon nitride, silicon oxynitride, a metal nitride, such as TiN, TaN, AlN, WN, etc., or any other nitride that may be conformally formed over the semiconductor device 200. The nitride spacer material 238 may be formed by sputtering, ALD, CVD, PVD, PECVD, LPCVD, or other suitable deposition process.

Figure 10:
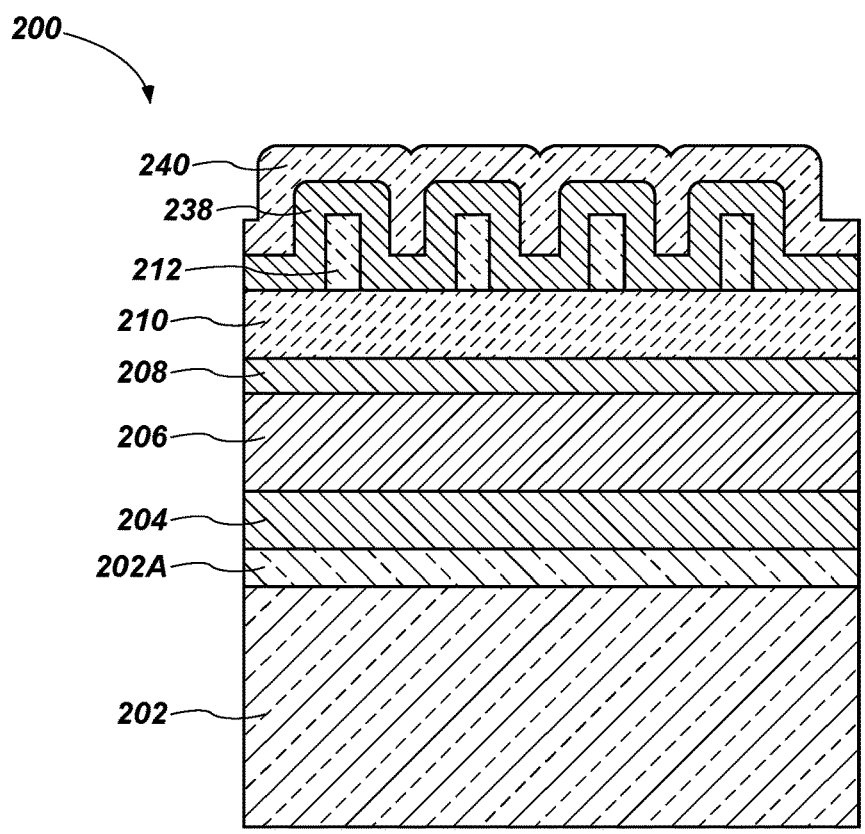

Referring to FIG. 10, another oxide material 240 may be formed over the nitride spacer material 238. The another oxide material 240 may be, for example, blanket deposited over the nitride spacer material 238 and may substantially fill gaps between adjacent portions of the nitride spacer material 238.

The another oxide material 240 may include a silicon oxide material, such as, for example, silicon dioxide. In some embodiments, the another oxide material 240 is the same as the spacer material 232 (FIG. 3) or the silicon oxide material 212. In other embodiments, the another oxide material 240 is different than each of the spacer material 232 and the silicon oxide material 212. The another oxide material 240 may be formed by sputtering, ALD, CVD, PVD, PECVD, LPCVD, or other suitable deposition process.

Figure 11A:
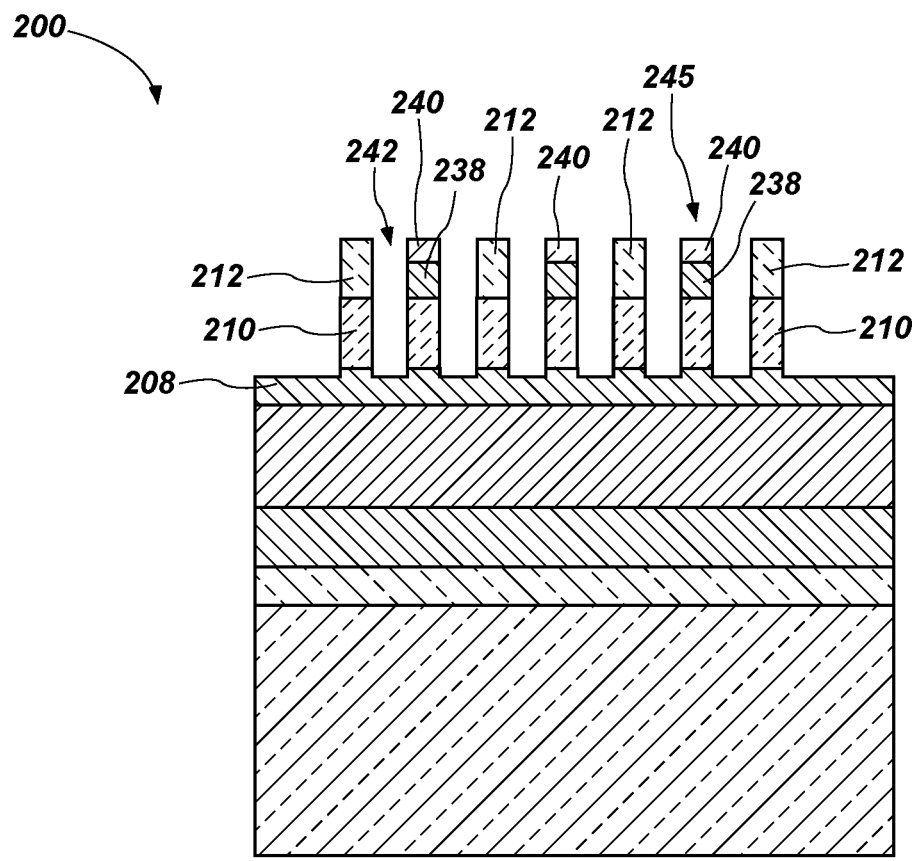

Referring to FIG. 11A, loops 245 of the another oxide material 240 and the nitride spacer material 238 may be formed by removing at least a top portion of the another oxide material 240 to expose at least some of the nitride spacer material 238 while other portions of the nitride spacer material 238 remain protected by the another oxide material 240. The exposed nitride spacer material 238 may be exposed to an etchant that selectively removes the nitride spacer material 238 relative to the another oxide material 240 and the etch selective material 210. The exposed nitride spacer material 238 (i.e., the nitride spacer material 238 that is not covered by the another oxide material 240) may be removed to form spaces 242 between the loops 245 and the adjacent silicon oxide material 212. With reference to FIG. 8A and FIG. 11A, the loops 245 may be formed at areas where the gaps 220 and the opening 236 between adjacent portions of the silicon oxide material 212 were previously located. In other words, a loop 245 may be located at areas where the gaps 220 and the openings 236 between adjacent portions of the silicon oxide material 212 were located. The pitch between adjacent portions of the another oxide material 240 and the nitride spacer material 238 may be substantially the same as the pitch between adjacent silicon oxide materials 212, but may be offset from the silicon oxide material 212 by about one half-pitch.

In some embodiments, each of the another oxide material 240, the nitride spacer material 238, and the etch selective material 210 may exhibit etch selectivities that are different from one another. While specific combinations of materials used as the another oxide material 240, the nitride spacer material 238, and the etch selective material 210 are described herein, other combinations of materials having the desired etch selectivity between materials may be used.

With continued reference to FIG. 11A, the semiconductor device 200 may then be exposed to an etchant formulated to selectively remove the etch selective material 210 without substantially removing the remaining another oxide material 240 and the nitride spacer material 238 of the loops 245.

Figure 11B:
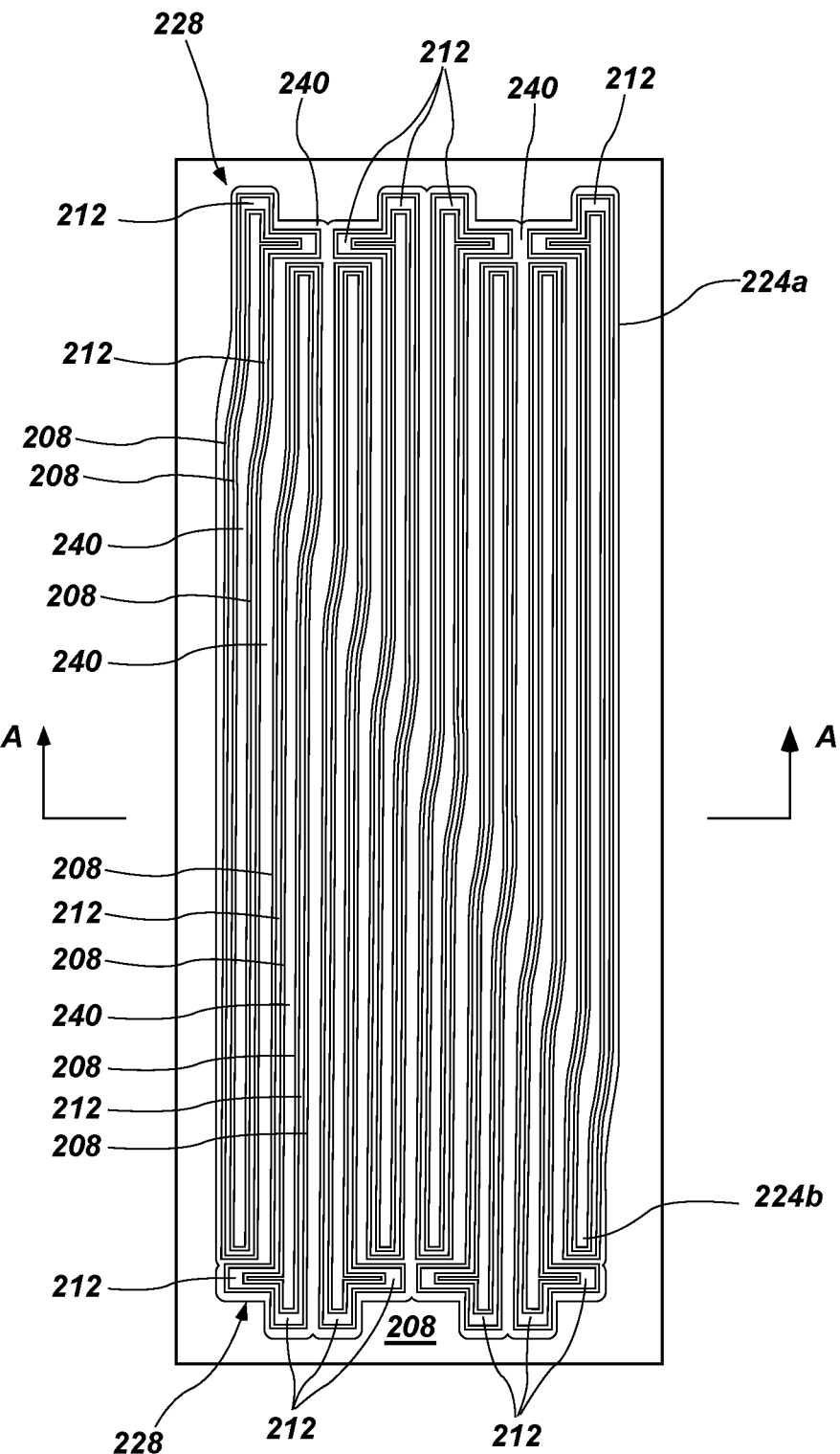

Referring to FIG. 11B, the silicon oxide material 212 may remain at the end portions 228 of the loops 215 (FIG. 8B) of the silicon oxide material 212 after removal of the another oxide material 240 and the nitride spacer material 238.

Figure 12A:
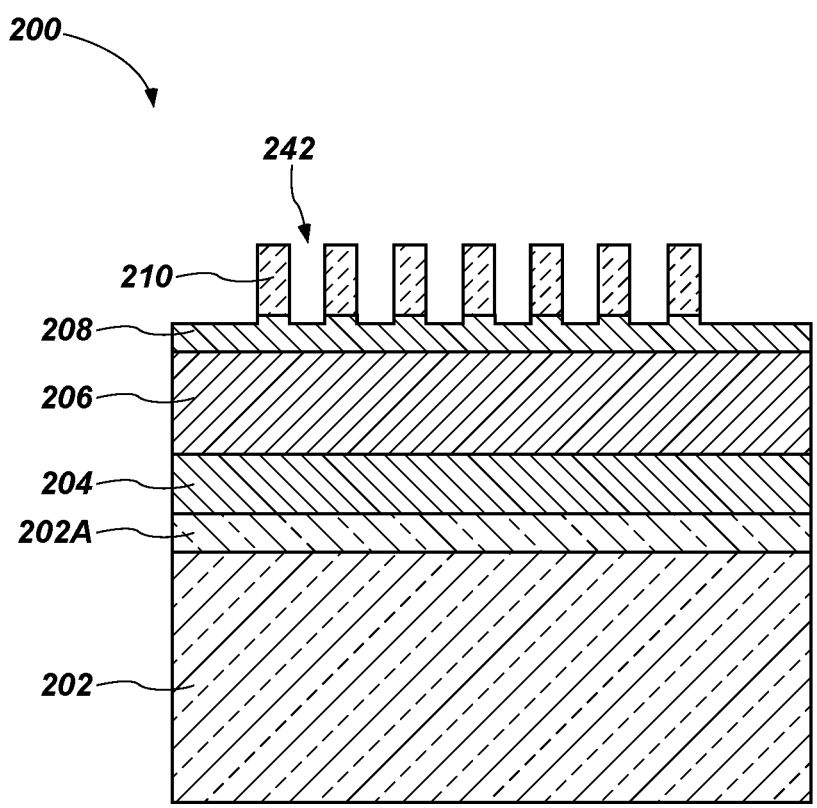

With reference to FIG. 12A, the loops 215 (FIG. 8B) of the silicon oxide material 212 and the loops 245 (FIG. 11A) may be removed from the semiconductor device 200. In some embodiments, the silicon oxide material 212, the another oxide material 240, and the nitride spacer material 238 are substantially completely removed from the semiconductor device 200 without substantially removing the etch selective material 210. As described above, the etch selective material 210 may be etched selectively relative to the another oxide material 240, the nitride spacer material 238, and the silicon oxide material 212. In some embodiments, the another oxide material 240, the nitride spacer material 238, and the silicon oxide material 212 may be removed by exposing the semiconductor device 200 to a plasma including one or more of $O_2$, $SF_6$, $CH_4$, $NF_3$, or other etchants known in the art to selectively remove the oxides and nitrides without substantially removing the etch selective material 210.

Figure 12B:
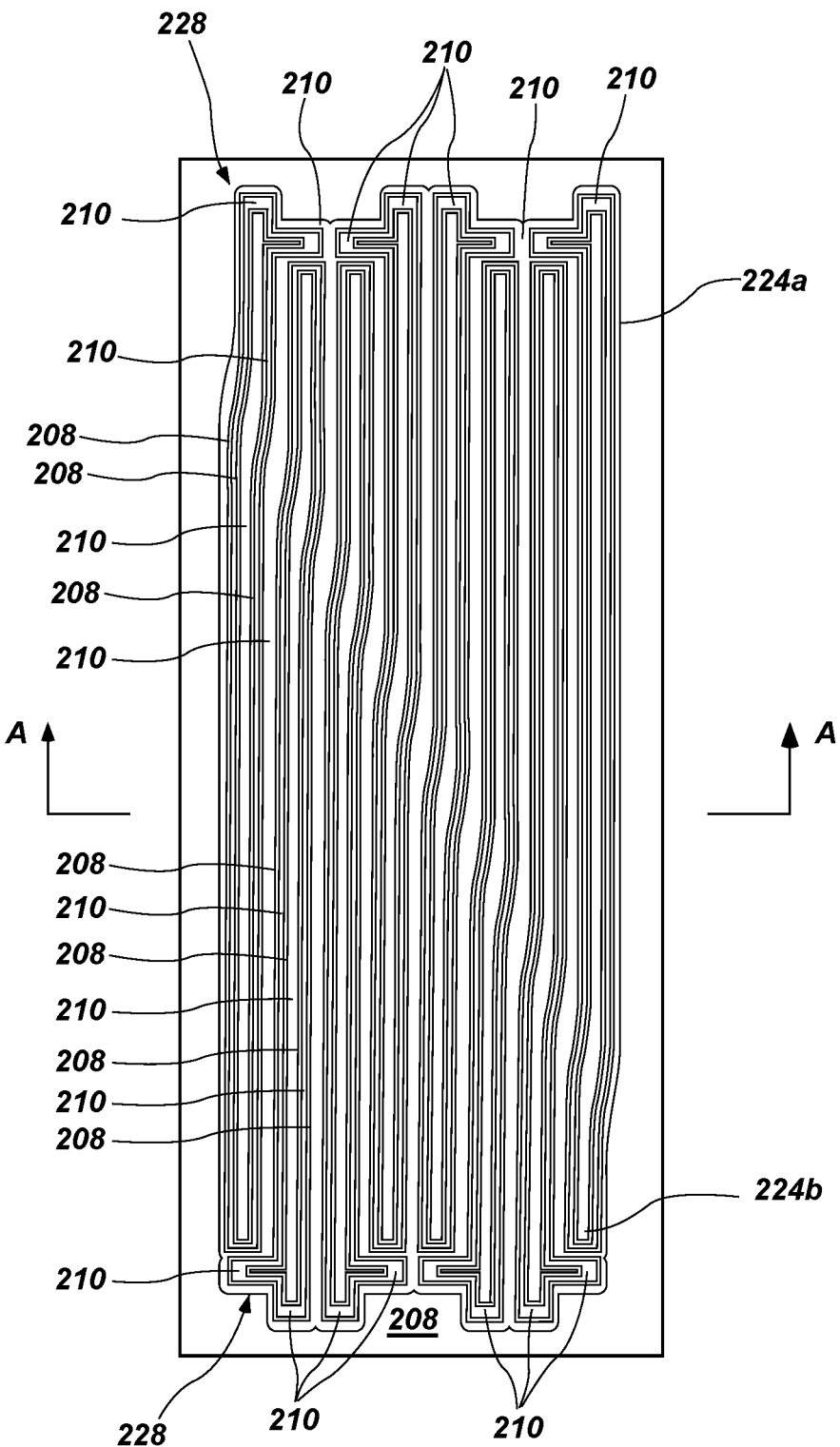

Referring to FIG. 12B, the pattern of the etch selective material 210 may be at the locations where the loops 245 of the another oxide material 240 and the nitride spacer material 238 and the loops 215 of the silicon oxide material 212 were previously. At least some of the end portions 228 of the etch selective material 210 may have a larger cross-sectional area than other portions of the etch selective material 210.

Figure 13A:
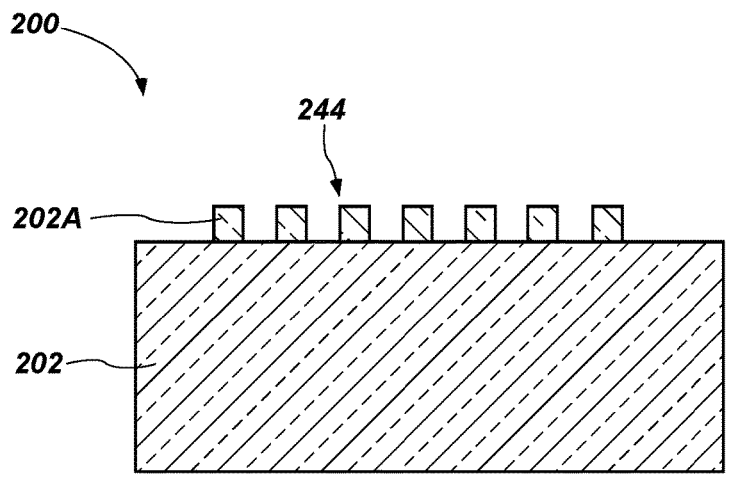

Referring to FIG. 13A, the pattern of the etch selective material 210 may be transferred to the conductive material 202A overlying the semiconductor material 202 (FIG. 2A). In some embodiments, the pattern of the etch selective material 210 is transferred through the another silicon nitride material 208, the oxide material 206, and the silicon nitride material 204 to the conductive material 202A. The pattern in the conductive material 202A may be formed by using the etch selective material 210 as a mask and removing exposed portions of the another silicon nitride material 208, the oxide material 206, and the silicon nitride material 204. Methods of transferring the pattern to the another silicon nitride material 208, the oxide material 206, and the silicon nitride material 204 are known in the art and therefore, are not described in detail herein.

Figure 13B:
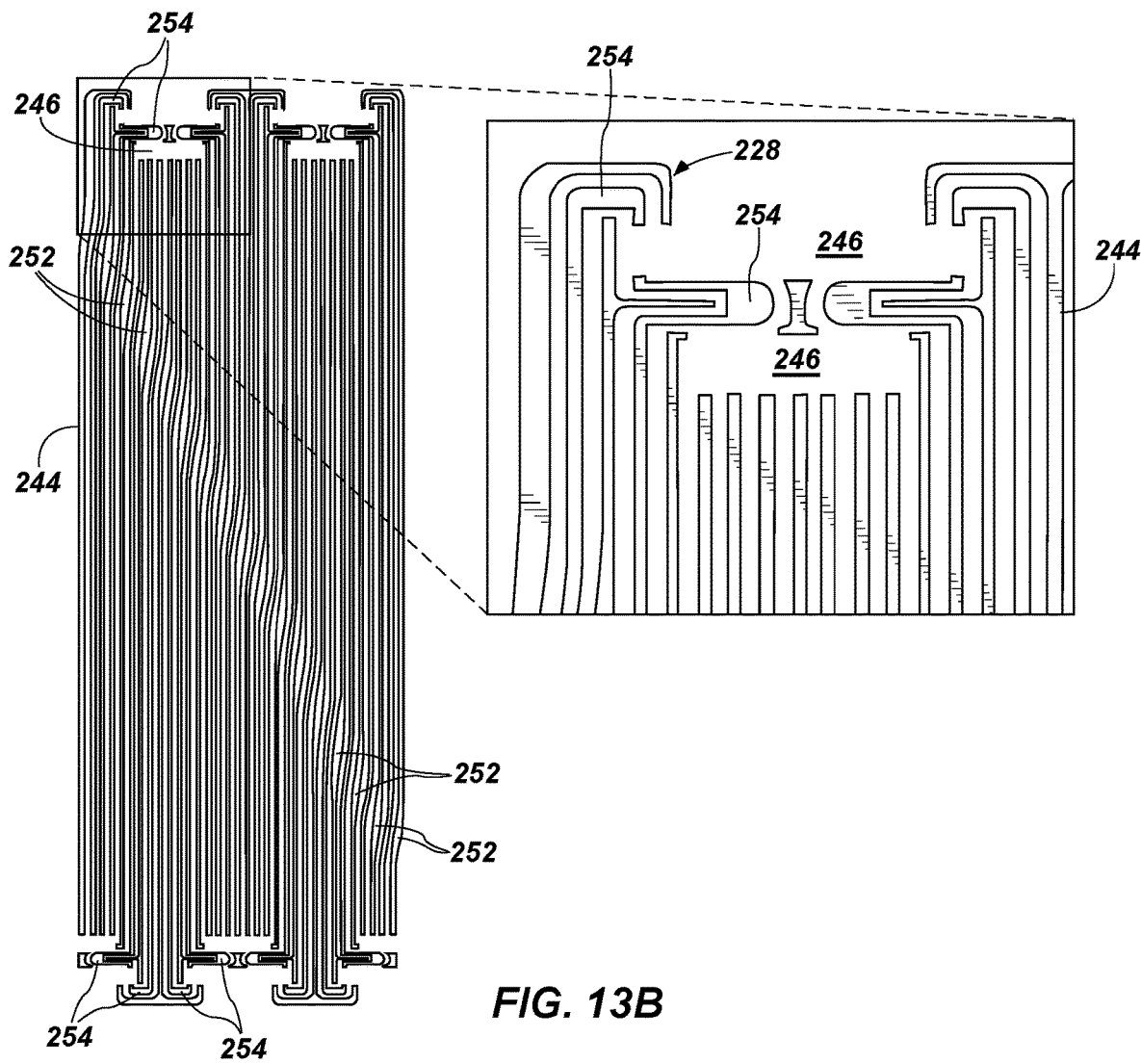

Portions of the conductive material 202A may be removed to form conductive lines 244 electrically isolated from one another. Referring to FIG. 13B, for every photoresist line 222 (FIG. 2B) formed initially, four conductive lines 244 may be formed. Adjacent conductive lines 244 may be separated from each other by between about 10 nm and about 20 nm and may have a width of between about 10 nm and about 20 nm. However, it is contemplated that the conductive lines 244 may be separated from each other by different distances and may have different widths and the present disclosure is not limited to such distances and widths. Each of the conductive lines 244 may be electrically isolated from one another.

In some embodiments, a mask having a plurality of apertures may be placed over the semiconductor device 200 at locations where it is desired to remove portions of the conductive material 202A and form openings 246 within the conductive material 202A. In some embodiments, at least some of the openings 246 may be formed proximate the end portions 228. About one half of the openings 246 may be formed at a first end of the semiconductor device 200 (e.g., the top of the semiconductor device illustrated in FIG. 13B) and about one half of the openings 246 may be formed at a second, opposite end of the semiconductor device 200 (e.g., the bottom of the semiconductor device 200 illustrated in FIG. 13B). The openings 246 may be generally rectangular in shape, although, in other embodiments, the shape of the openings 246 may be triangular, circular, or any shape suitable for forming conductive lines 244 electrically isolated from one another.

With continued reference to FIG. 13B, every other conductive line 244 may include a portion that is wider than other portions of the respective conductive line 244 that corresponds to the enlarged portion 230 in the photoresist material 218 (FIG. 2B) and, thus, is located between end portions 228 of a conductive line 244. At least some of the conductive lines 244 may include a contact landing pad 252 that includes an enlarged portion of the conductive line 244, the enlarged portion located between the end portions 228 of the conductive line 244. The contact landing pad 252 may be formed on conductive lines 244 corresponding to locations of the loops 245 (FIG. 11A). A conductive contact may be formed on each of the contact landing pads 252. The contact landing pads 252 may extend in a generally diagonal direction across the semiconductor device 200 such that the contact landing pads 252 of conductive lines 244 proximate each other are laterally and longitudinally offset from one another. At least some of the conductive lines 244 may be different than the conductive lines 244 including the contact landing pads 252 within the array region. Some such conductive lines 244 may include a contact landing pad 254 at an end portion 228 of such conductive lines 244. The contact landing pads 254 may include a larger cross-sectional area than other portions of the respective conductive lines 244. The contact landing pads 254 at the end portions 228 may comprise about one half of the contact pads of the conductive lines 244 (or of the memory array). The conductive lines 244 with the contact landing pads 254 may correspond to conductive lines 244 formed in locations where the loops 215 of the silicon oxide material 212 (FIG. 11B) were.

Figure 14:
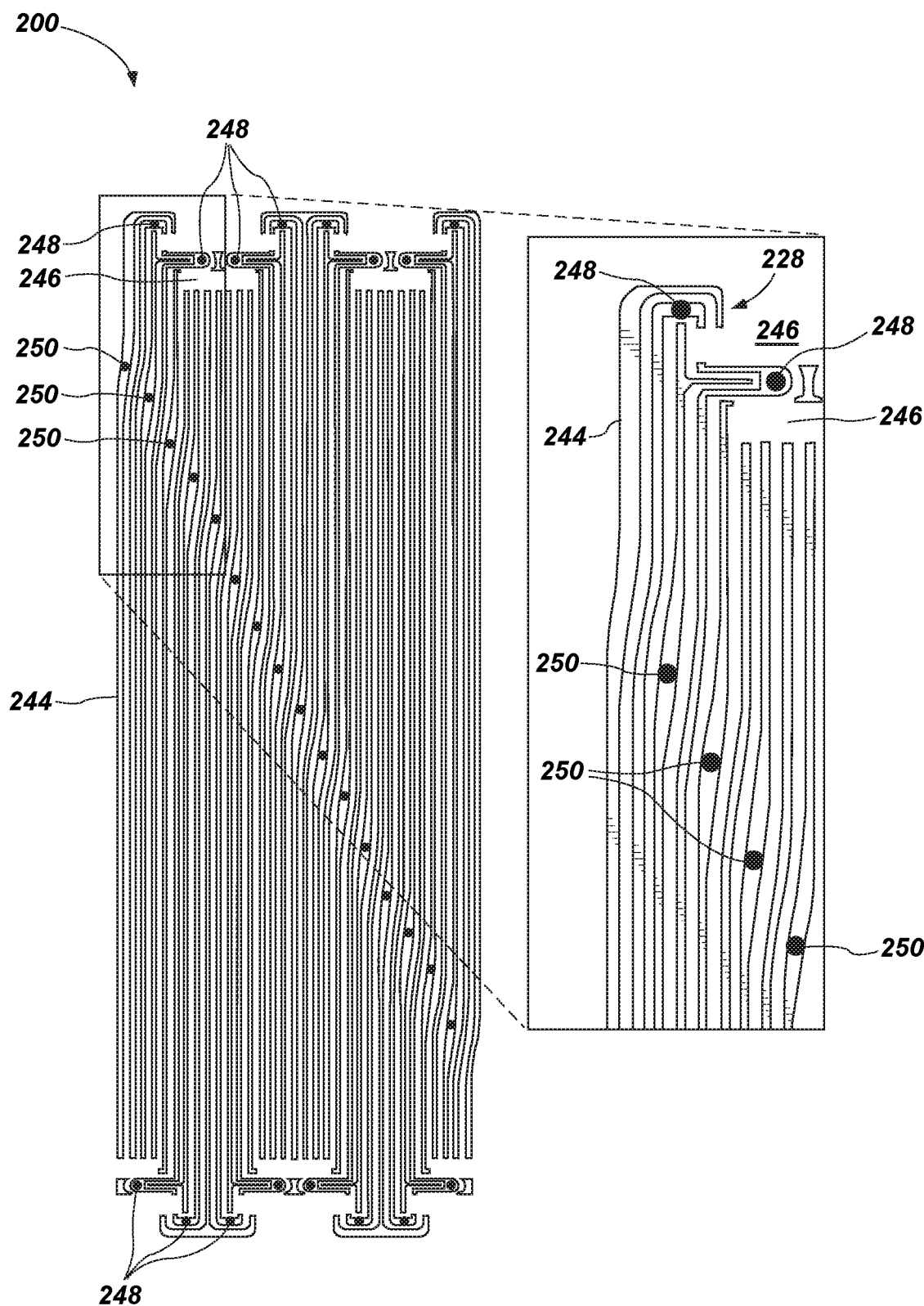

Referring to FIG. 14, conductive contacts 248, 250 may be formed on each of the conductive lines 244 at the contact landing pads 252, 254 (FIG. 13B). Conductive contacts 250 may be formed on the contact landing pads 252 between end portions 228 of the conductive lines 244 and conductive contacts 248 may be formed on the contact landing pads 254 at an end portion 228 of the conductive lines 244.

The contact landing pads 252 may provide larger areas (e.g., may have a larger cross-sectional area) for the conductive contacts 250 to form a contact with the conductive lines 244. The contact landing pads 254 at the end portions 228 may provide a larger area for forming conductive contacts 248 at end portions 228 of the conductive lines 244. By providing the contact landing pads 252 on every other conductive line 244 and providing the contact landing pads 254 at the end portions 228 of the conductive lines 244, the conductive contacts 248, 250 may have a larger contact area than in conventional semiconductor devices. Accordingly, conductive contacts 248, 250 may be formed on conductive lines 244 including line spacing of about 20 nm or less. Advantageously, the conductive contacts 248, 250 are not arranged in a "shark-jaw" pattern that reduces the use of available area on the semiconductor device 200.

Although the conductive contacts 248, 250 are described as being formed on the conductive lines 244, it is contemplated that the conductive contacts 248, 250 are in electrical communication with the conductive lines 244 other than being disposed directly on the conductive lines 244. For example, in some embodiments, the conductive lines 244 including the enlarged portions 230 and end portions 228 having a larger cross-sectional area than other portions thereof (e.g., including the contact landing pads 252, 254) may be formed over conductive contacts 248, 250. Accordingly, the conductive contacts 248, 250 may be formed in electrical communication with the contact landing pads 252, 254.

Thus, on pitch conductive contacts may be formed on conductive lines of a semiconductor device in which the widths of the conductive lines are below the resolution limits of conventional photolithographic techniques without sacrificing real estate of the semiconductor device. The conductive contacts may be formed on contact landing pads formed on the enlarged portions of the conductive lines. Since the enlarged portions of the conductive lines have a greater cross-sectional surface area than other portions of the conductive lines, margins for forming the contact landing pads and conductive contacts may be increased. The contact landing pads and the conductive contacts may be large enough to allow for alignment of the contact landing pads and the conductive contacts with their respective conductive lines. Similarly, the conductive contacts may be registered to their respective conductive lines such that each conductive line is in electrical communication with one conductive contact. The conductive lines may be patterned so that the conductive contacts on adjacent lines do not span across multiple conductive lines while the conductive contacts remain large enough that sufficient contact is made between each conductive contact and associated conductive line.

Accordingly, in one embodiment a semiconductor device comprises first conductive lines each comprising a first portion, a second portion, and an enlarged portion, the enlarged portion connecting the first portion and the second portion of the first conductive line, second conductive lines, at least some of the second conductive lines disposed between a pair of the first conductive lines, each second conductive line including a larger cross-sectional area at an end portion of the second conductive line than at other portions thereof, and a pad on each of the first conductive lines and the second conductive lines, wherein the pad on each of the second conductive lines is on the end portion thereof and the pad on the each of the first conductive lines is on the enlarged portion thereof.

In another embodiment, a semiconductor device comprises conductive lines over a semiconductor substrate including memory cells, wherein at least some of the conductive lines include an enlarged portion located between end portions of the respective conductive line, wherein the enlarged portion is wider than other portions of the respective conductive line; and at least some of the conductive lines include an end portion having a larger cross-sectional area than other portions thereof.

In a further embodiment, a semiconductor device comprises conductive lines extending over memory cells of a semiconductor device, every other conductive line including an enlarged portion between end portions of the conductive line, the enlarged portion having a larger cross-sectional area than other portions of the conductive line.

In yet another embodiment, a method of forming a semiconductor device comprises forming conductive lines over a semiconductor device, forming the conductive lines comprising forming every other conductive line to have a first portion and a second portion connected to the first portion by an enlarged portion, forming pads on at least some of the conductive lines at an end portion of the respective conductive lines, and forming pads on the enlarged portions of at least some of the conductive lines.

Another method of forming a semiconductor device includes forming lines of a photoresist material on a semiconductor device, each line of the photoresist material comprising a widened portion relative to other portions of the respective line of photoresist material, forming spacers on sidewalls of the lines of the photoresist material, removing the lines of the photoresist material, forming a nitride material over the spacers, removing a portion of the nitride material to form loops of the nitride material surrounding the spacers, and transferring a pattern of the loops of the nitride material and the spacers to an underlying conductive material to form a pattern of conductive lines, at least some of the conductive lines having a widened portion relative to other portions of the respective conductive line.

Although the conductive contacts 248, 250 are described and illustrated as being formed by one method of pitch doubling and pitch multiplication to form four conductive lines 244 from a single photoresist line 222 (FIG. 2B), it is contemplated that other methods of pitch multiplication or pitch doubling may be used to form conductive contacts 248, 250 having a larger contact area than other semiconductor devices.

Figure 15A:
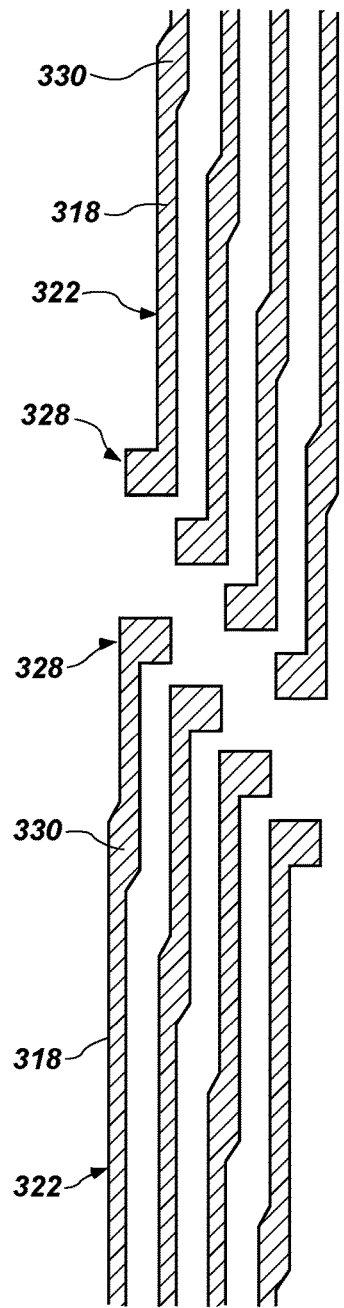
FIG. 15A through FIG. 15E are plan views of a semiconductor device during various stages of fabrication, in accordance with another embodiment of the present disclosure.

Referring to FIG. 15A through 15E, another embodiment of forming contact landing pads 352,354 (FIG. 15E) is illustrated. Referring to FIG. 15A, the method may include patterning a photoresist material 318 to form photoresist lines 322 over a semiconductor device, similar to the photoresist material 218 described above with reference to FIG. 2A and FIG. 2B. The photoresist lines 322 may include end portions 328 having an enlarged area where at least some of the contact landing pads will be formed, as described herein. The photoresist lines 322 may each include an enlarged portion 330 having a larger cross-sectional area than other portions of the photoresist lines 322, similar to the enlarged portions 230 described above with reference to FIG. 2B. For example, the enlarged portions 330 may be located between end portions 328 of the photoresist lines 322. The photoresist lines 322 may be formed using conventional photolithography techniques and then portions of the photoresist material 318 removed to a desired width, as described above with reference to FIG. 3. The end portions 328 of the photoresist lines 322 may be located within an array region of the semiconductor device.

Figure 15B:
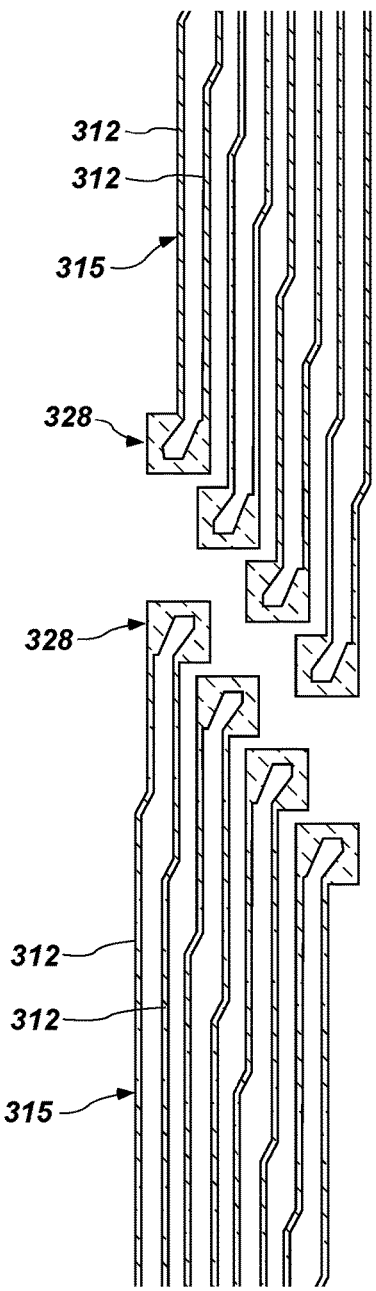

Referring to FIG. 15B, spacers 312 may be formed on sidewalls of the photoresist material 318 in a pitch doubling process, as described above with reference to FIG. 3 through FIG. 5B. The photoresist material 318 may be removed from the semiconductor device after forming the spacers 312 on the sidewalls of the photoresist material 318. The end portions 328 may include a larger cross-sectional area of the material of the spacers 312 than other portions of the semiconductor device. Loops 315 of the spacers 312 may remain after removing the photoresist material 318.

Figure 15C:
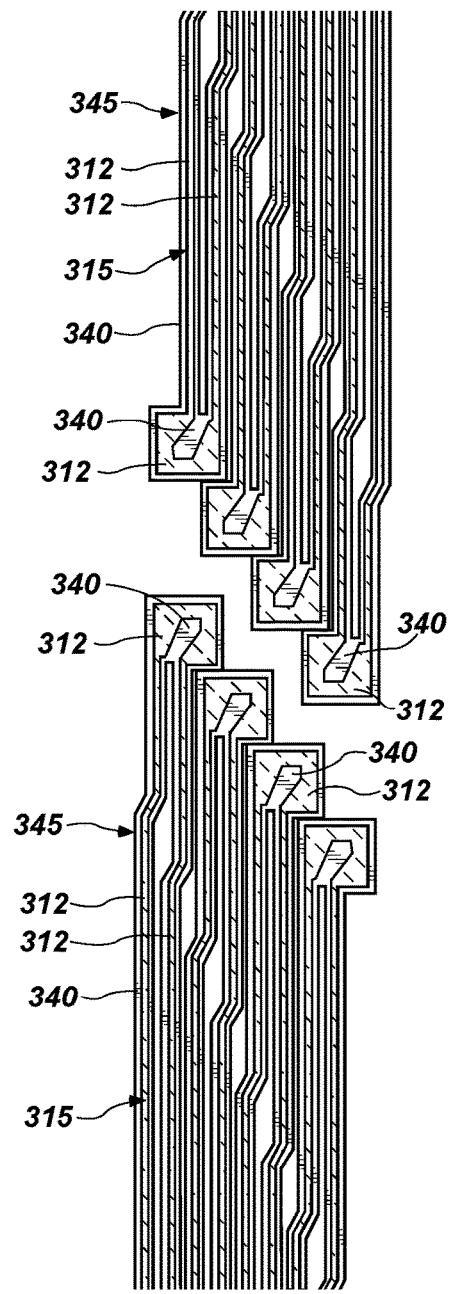

Referring to FIG. 15C, another spacer material 340 may be formed around the spacers 312 to form loops 345 of the another spacer material 340. In some embodiments, there are twice as many loops 345 of the another spacer material 340 as the number of loops 315 of the spacers 312. In some such embodiments, each loop 315 of the spacers 312 may be surrounded by one loop 345 on outside walls thereof and one loop 345 on inside walls thereof.

Figure 15D:
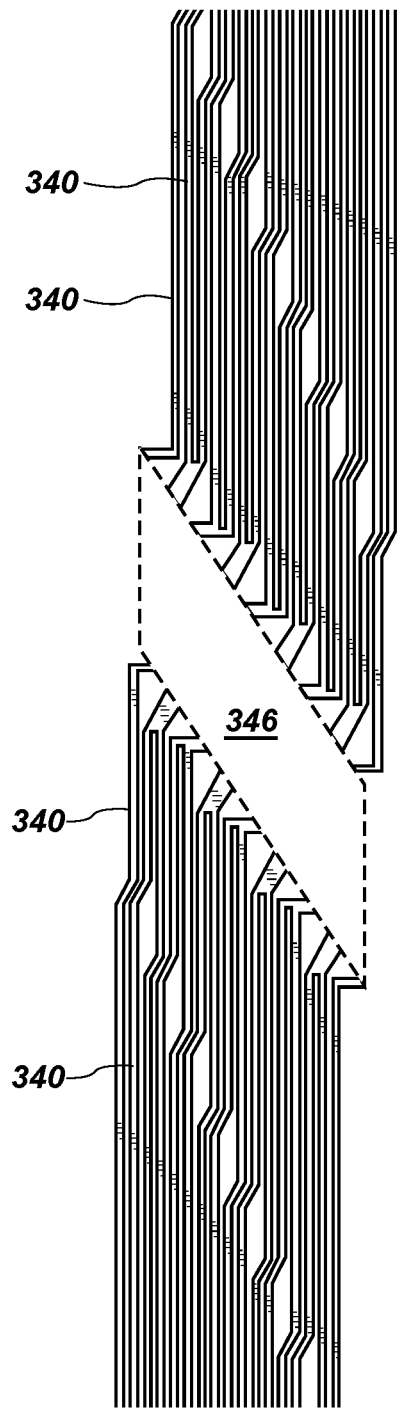

Referring to FIG. 15D, the spacers 312 may be removed from the semiconductor device, leaving the another spacer material 340. A mask including apertures may be placed over the semiconductor device to form openings 346 (shown in dashed lines in FIG. 15D) in the semiconductor device. In some embodiments, the mask may include a single aperture having a generally rectangular shape extending in a diagonal direction. Forming the openings 346 may isolate the loops 345 of the another spacer material 340 and form a pattern of lines of the another spacer material 340.

Figure 15E:
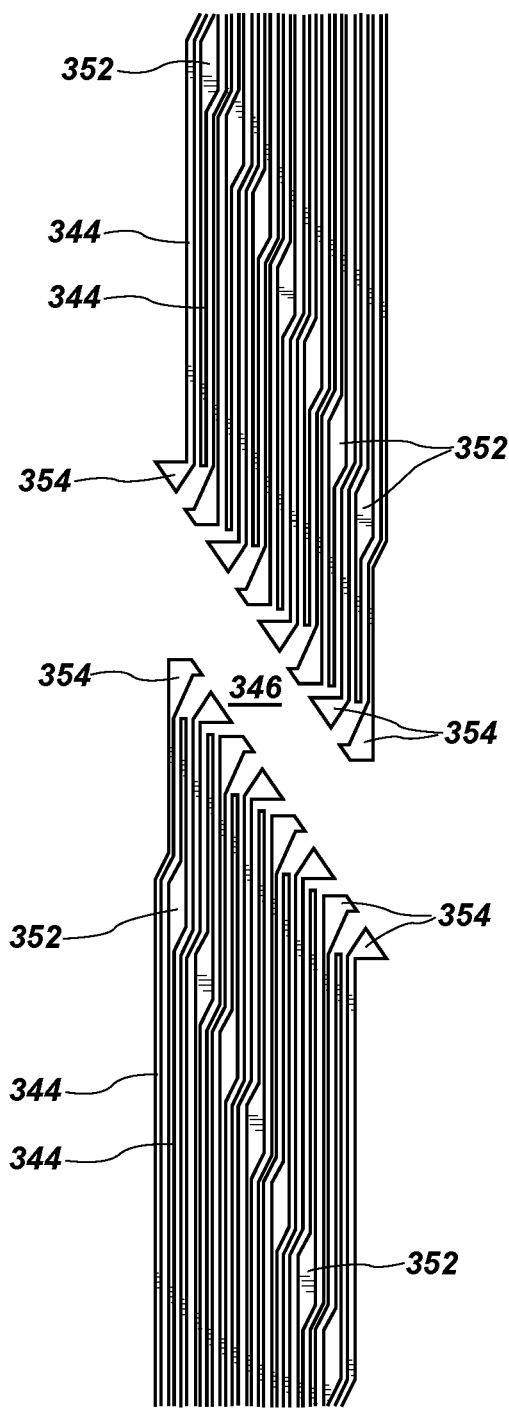

Referring to FIG. 15E, the pattern of the another spacer material 340 may be reversed to form a pattern in a conductive material overlying the semiconductor device and form conductive lines 344. In other words, the pattern of the conductive lines 344 may be opposite the pattern of the another spacer material 340 in that the conductive lines 344 are located in positions where openings or spacers were previously located. The conductive lines 344 may be formed in a conductive material that overlies a substrate of the semiconductor device. There may be four times as many conductive lines 344 as photoresist lines 322 (FIG. 15A).

Contact landing pads 354 may be formed at end portions 328 of at least some of the conductive lines 344 and contact landing pads 352 may be formed on at least some of the conductive lines 344 between the end portions 328 of at least some of the other conductive lines 344, as described above with reference to FIG. 14. The contact landing pads 352 may be formed on every other conductive line 344 at the enlarged portions 330. The contact landing pads 354 may be formed on every other conductive line 344 at terminal portions of the conductive lines 344. Conductive contacts may be formed over each of the contact landing pads 352, 354. Accordingly, conductive contacts may be formed within an array region of the semiconductor device. At least some of the conductive contacts may be formed on the conductive lines 344 between end portions 328 of the respective conductive line 344 and at least some of the conductive contacts may be formed at end portions 328 of the conductive lines 344.

Figure 16A:
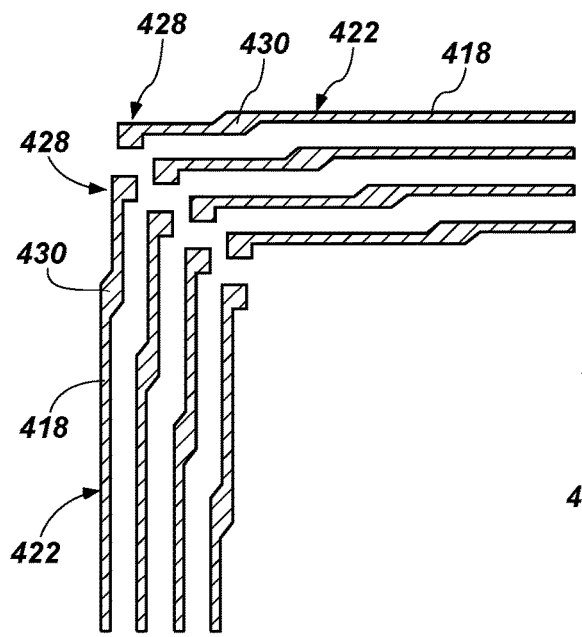
FIG. 16A through FIG. 16C are plan views of a semiconductor device during various stages of fabrication, in accordance with yet another embodiment of the present disclosure.
Figure 16B:
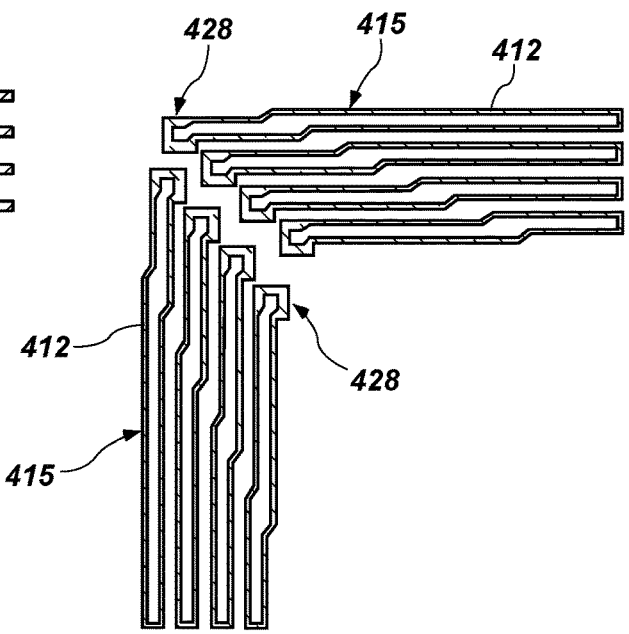
Figure 16C:
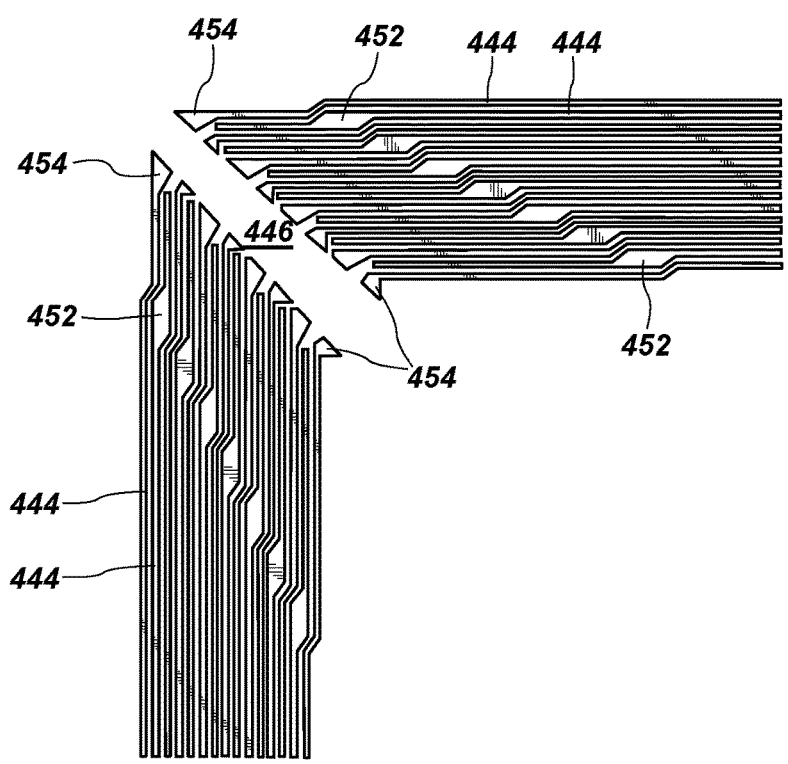

FIG. 16A through FIG. 16C illustrate a method of forming contact landing pads according to another embodiment of the present disclosure. Referring to FIG. 16A, a photoresist material 418 may be patterned to form photoresist lines 422 over a semiconductor device. The photoresist material 418 may be substantially similar to the photoresist material 218 described above with reference to FIG. 2A. Some of the photoresist lines 422 may extend in a generally horizontal direction and some of the photoresist lines 422 may extend in a generally vertical direction. The photoresist lines 422 extending in the generally horizontal direction and the photoresist lines 422 extending in the generally vertical direction may be spaced apart from one another and may be oriented substantially perpendicular from one another. Each of the photoresist lines 422 may include enlarged portions 430 where contact landing pads will be formed, as described herein. End portions 428 of each of the photoresist lines 422 may also include relatively larger portions where other contact landing pads will be formed. The end portions 428 of the photoresist lines 422 may be separated from one another at a corner of the semiconductor device.

Referring to FIG. 16B, spacers 412 may be formed on sidewalls of the photoresist material 418 and portions of the photoresist material 418 may be removed from the semiconductor device, as described above with reference to FIG. 3 through FIG. 5B. Loops 415 of the spacers 412 may remain after removing the photoresist material 418.

Referring to FIG. 16C, a pattern of conductive lines 444 in a conductive material may be formed over the semiconductor device as described above with reference to FIG. 15C and FIG. 15D. For example, a pitch doubling process may be performed on the loops 415 of the spacers 412 as described above with reference to FIG. 15C. The resulting pattern may be transferred to a conductive material to form the conductive lines 444 as described above with reference to FIG. 15D and FIG. 15E. Some of the conductive lines 444 may extend in a first, horizontal direction and some of the conductive lines 444 may extend in a second, vertical direction that is perpendicular to the first direction.

Openings 446 may electrically isolate each of the conductive lines 444. The conductive lines 444 may include contact landing pads 454 at the end portions 428 of at least some of the conductive lines 444 and contact landing pads 452 on at least some of the conductive lines 444, such as between end portions 428 of the respective conductive lines 444. In some embodiments, the contact landing pads 452 are located within an array region of the semiconductor device. The contact landing pads 452 may be formed on every other conductive line 444 at the enlarged portions 430. Conductive contacts may be formed over each of the contact landing pads 452, 454. Accordingly, conductive contacts may be formed within an array region of the semiconductor device. At least some of the conductive contacts may be formed on the conductive lines 444 between the end portions 428 of the conductive lines 444 and at least some of the conductive contacts may be formed at end portions 428 of the conductive lines 444. In some embodiments, the end portions 428 may be located within the array region of the semiconductor device.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure as contemplated by the inventors.

What is claimed is:

1. A method of forming a semiconductor device, the method comprising:
    forming a first group of conductive lines comprising first conductive lines extending in a first direction;
    forming a conductive contact on each first conductive line on an enlarged portion of the respective first conductive line at an end portion located at a terminal region of the respective first conductive line, the conductive contact of at least one first conductive line longitudinally aligned with and laterally offset from the conductive contact of at least another first conductive line;

forming a second group of conductive lines comprising second conductive lines extending in the first direction, forming the second group of conductive lines comprising forming each second conductive line to be located adjacent to at least one of the first conductive lines; and forming a conductive contact on each of the second conductive lines on an enlarged portion of the respective second conductive line and between end portions thereof.

2. The method of claim 1, wherein forming a second group of conductive lines extending in the first direction comprises forming about the same number of second conductive lines as a number of the first conductive lines.

3. The method of claim 1, wherein forming a conductive contact on each first conductive line on an enlarged portion of the respective first conductive line at an end portion located at a terminal region of the respective first conductive line comprises forming about one-half of the conductive contacts of the first conductive lines at a first terminal region of the first conductive lines and forming about one-half of the conductive contacts of the first conductive lines at a second, opposite terminal region of the first conductive lines.

4. The method of claim 3, wherein forming about one-half of the conductive contacts of the first conductive lines at a first terminal region of the first conductive lines comprises forming the conductive contacts of the first conductive lines at the first terminal region of the first conductive lines to be laterally and longitudinally offset from at least one other of the conductive contacts of the first conductive lines at the first terminal region and longitudinally aligned with at least a second other of the conductive contacts of the first conductive lines at the first terminal region.

5. A method of forming a semiconductor device, the method comprising:

forming lines of a photoresist material on a semiconductor device, each line of the photoresist material comprising a widened portion relative to other portions of the respective line of photoresist material;

forming spacers on sidewalls of the lines of the photoresist material;

removing the lines of the photoresist material;

removing portions of a sacrificial material and an oxide material through openings between the spacers;

removing the spacers and the sacrificial material and leaving first loops of the oxide material;

forming a nitride material over the oxide material and forming another oxide material over the nitride material;

removing a portion of the nitride material to form second loops comprising the nitride material and the another oxide material; and transferring a pattern of the first loops and the second loops to an underlying conductive material and removing a portion of the underlying conductive material to form a pattern of conductive lines, at least some of the conductive lines of the pattern of conductive lines having a widened portion relative to other portions of the respective conductive lines.

6. The method of claim 5, further comprising removing the photoresist material from between end portions of the lines of the photoresist material while a portion of the photoresist material remains at the end portions of the lines of the photoresist material.

7. The method of claim 5, wherein forming a pattern of conductive lines comprises forming four times as many conductive lines as lines of the photoresist material.

8. The method of claim 5, wherein forming a pattern of conductive lines comprises forming about one-half of the conductive lines of the pattern of conductive lines comprising the widened portion at end portions thereof and about one-half of the conductive lines of the pattern of conductive lines comprising the widened portion between end portions thereof.

9. The method of claim 5, further comprising forming conductive contacts on the widened portion of the conductive lines, wherein forming conductive contacts on the widened portion of the conductive lines comprises:

forming a conductive contact between end portions of a first set of conductive lines to be longitudinally and laterally offset from other conductive contacts; and forming a conductive contact at end portions of a second set of conductive lines, some of the conductive contacts at end portions of the second set of conductive lines longitudinally offset from other conductive contacts of the second set of conductive lines.

10. The method of claim 5, further comprising trimming the lines of photoresist material prior to forming spacers on sidewalls of the lines of photoresist material.

11. The method of claim 5, wherein forming a pattern of conductive lines comprises forming adjacent conductive lines of the pattern of conductive lines to be spaced from each other by between about 10 nm and about 20 nm.

12. A method of forming a semiconductor device, the method comprising:

forming spacers on sides of lines of a photoresist material;

removing the lines of the photoresist material to form a pattern of the spacers;

transferring the pattern of the spacers to an oxide material and removing the spacers to form first lines comprising the oxide material;

forming a nitride material over the first lines;

forming another oxide material over the nitride material;

removing a portion of the another oxide material to expose at least a portion of the nitride material while at least another portion of the another oxide material remains;

removing exposed portions of the nitride material to form second lines comprising the another oxide material and the nitride material between adjacent first lines; and transferring a pattern of the first lines and the second lines to a conductive material to form conductive lines.

13. The method of claim 12, wherein removing exposed portions of the nitride material comprises selectively removing the exposed portions of the nitride material relative to the another oxide material.

14. The method of claim 12, further comprising forming conductive contacts proximate end portions of about one half of the conductive lines.

15. The method of claim 14, further comprising forming conductive contacts between end portions of another about one half of the conductive lines.

16. The method of claim 12, wherein transferring a pattern of the first lines and the second lines to a conductive material to form conductive lines comprises removing portions of the conductive material to electrically isolate the conductive lines from each other.

17. The method of claim 12, wherein transferring a pattern of the first lines and the second lines to a conductive material to form conductive lines comprises:

forming about one half of the conductive lines to have an enlarged portion between end portions thereof; and forming about another one half of the conductive lines to have a larger cross-sectional area at an end portion thereof than at other portions thereof.

18. The method of claim 12, further comprising forming conductive contacts on at least some of the conductive lines, wherein the conductive contacts are laterally and longitudinally offset from each other.

19. The method of claim 18, further comprising forming additional conductive contacts on at least other conductive lines of the conductive lines, wherein some of the additional conductive contacts are longitudinally aligned with at least some of the additional conductive contacts and longitudinally offset from other additional conductive contacts of the additional conductive contacts.

20. The method of claim 12, further comprising forming the lines of the photoresist material to have enlarged portions between end portions thereof.

* * * * *